(12) United States Patent  (10) Patent No.: US 9,018,067 B2
Usujima  (45) Date of Patent: Apr. 28, 2015

(54) SEMICONDUCTOR DEVICE WITH POCKET REGIONS AND METHOD OF MANUFACTURING THE SAME

(71) Applicant: Fujitsu Semiconductor Limited, Yokohama-shi, Kanagawa (JP)

(72) Inventor: Akihiro Usujima, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/137,193

(22) Filed: Dec. 20, 2013

(65) Prior Publication Data
US 2014/0113422 A1  Apr. 24, 2014

Related U.S. Application Data

(62) Division of application No. 12/958,555, filed on Dec. 2, 2010, now Pat. No. 8,637,938.

(30) Foreign Application Priority Data

Dec. 28, 2009 (JP) ................................. 2009-297363

(51) Int. Cl.
*H01L 29/06* (2006.01)
*H01L 29/78* (2006.01)
*H01L 29/10* (2006.01)
(Continued)

(52) U.S. Cl.
CPC ....... *H01L 29/0619* (2013.01); *H01L 21/26586* (2013.01); *H01L 29/1083* (2013.01); *H01L 29/665* (2013.01); *H01L 29/6656* (2013.01); *H01L 29/6659* (2013.01); *H01L 29/66659* (2013.01); *H01L 29/7835* (2013.01); *H01L 29/7816* (2013.01)

(58) Field of Classification Search
USPC .................................................. 257/E21.618
See application file for complete search history.

(56) References Cited

U.S. PATENT DOCUMENTS 5,359,221 A * 10/1994 Miyamoto et al. ............ 257/408
5,759,901 A * 6/1998 Loh et al. ...................... 438/305
6,333,217 B1 * 12/2001 Umimoto et al. ............. 438/197
(Continued)

FOREIGN PATENT DOCUMENTS

JP  5-275693 A  10/1993
JP  6-29522 A  2/1994
(Continued)

OTHER PUBLICATIONS

Notification of Reasons for Refusal dated Oct. 22, 2013 in corresponding Japanese Application No. 2009-297363 w/English translation. (4 pages).

*Primary Examiner* — Long K Tran
*Assistant Examiner* — Jordan Klein
(74) *Attorney, Agent, or Firm* — Westerman, Hattori, Daniels & Adrian, LLP

(57) ABSTRACT

A semiconductor device includes a first pocket region and a second pocket region. The source region includes a first extension region having a concentration peak located at a first depth from a surface of the semiconductor substrate, and the first pocket region has a concentration peak located deeper than the first depth, and the drain region includes a second extension region having a concentration peak located at a second depth from the surface of the semiconductor substrate, and the second pocket region has a concentration peak located shallower than the second depth.

6 Claims, 32 Drawing Sheets

(51) Int. Cl.
*H01L 21/265* (2006.01)
*H01L 29/66* (2006.01)

(56) References Cited

U.S. PATENT DOCUMENTS 7,615,453 B2 * 11/2009 Minami .................. 438/276
7,638,399 B2 * 12/2009 Tsujii .................... 438/286
8,350,342 B2 * 1/2013 Noda ..................... 257/408
2007/0128814 A1 * 6/2007 Fukuda ................... 438/297
2008/0293204 A1 * 11/2008 Nieh et al. ............... 438/291
2010/0244150 A1 * 9/2010 Bahl et al. ............... 257/408

FOREIGN PATENT DOCUMENTS

| JP | 2001-7331 A | 1/2001 |
| JP | 2007-173421 A | 7/2007 |
| JP | 2007-335704 A | 12/2007 |

* cited by examiner

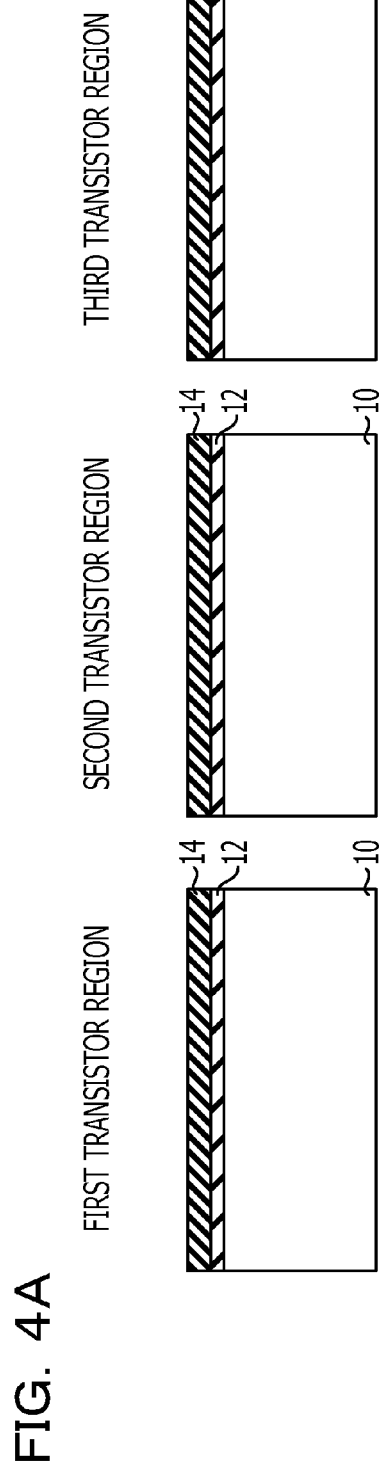
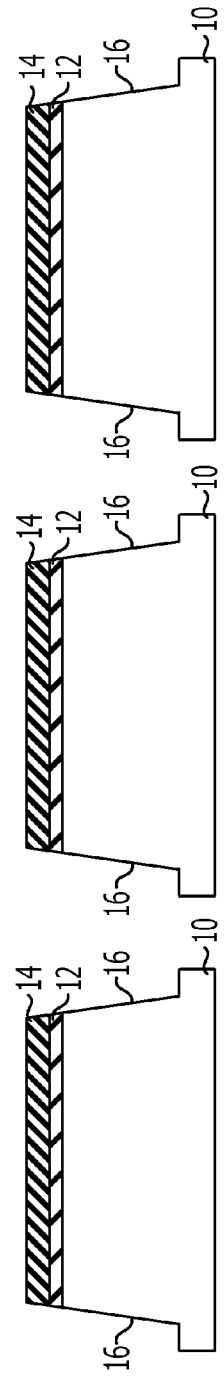

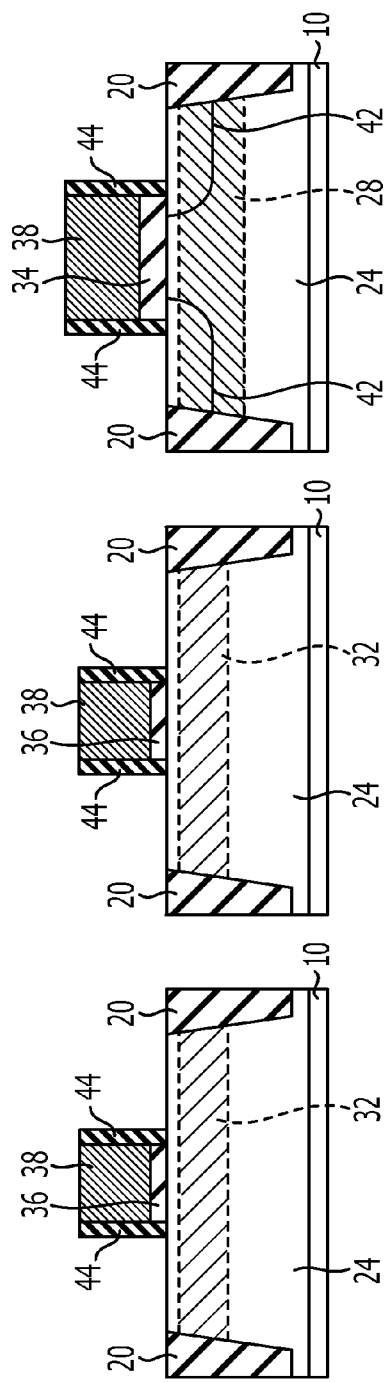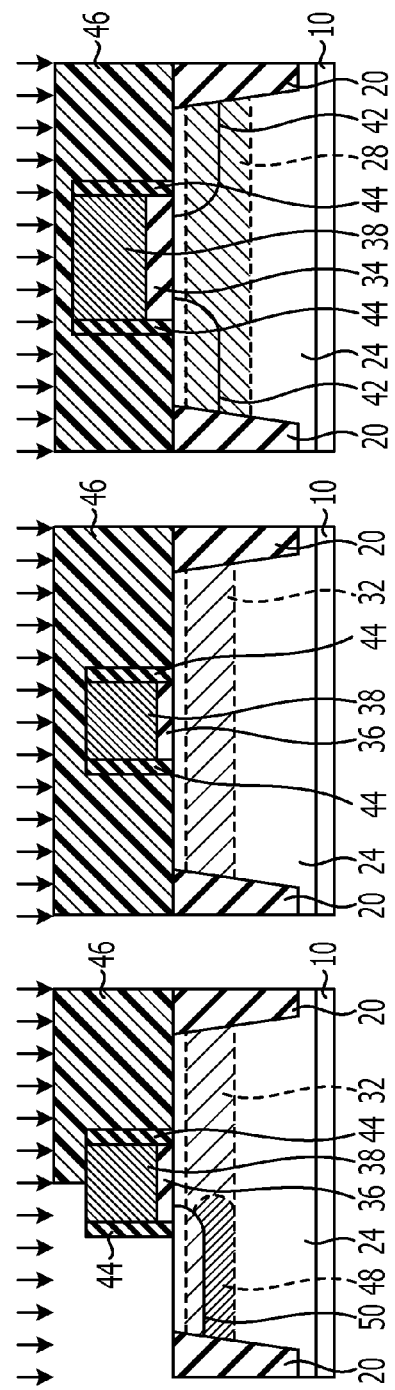
FIG. 9A
FIG. 9B

SEMICONDUCTOR DEVICE WITH POCKET REGIONS AND METHOD OF MANUFACTURING THE SAME

CROSS-REFERENCE TO RELATED APPLICATION

This Application is a Divisional of copending U.S. application Ser. No. 12/958,555 filed Dec. 2, 2010, which is based upon and claims priority under 35 U.S.C. §119(a) to Japan Patent Application No. 2009-297363 filed Dec. 28, 2009.

FIELD

The present invention relates to a semiconductor device and a method of manufacturing the semiconductor device.

BACKGROUND

It is desirable that semiconductor devices such as microcomputers applied, for example, to in-vehicle LSI products are low-power-consumption semiconductor devices. Accordingly, an MIS transistor that is included in a semiconductor device is required to allow a low-voltage operation, have a large driving current, and have a low leakage current.

A conventional low-power-consumption MIS transistor has been proposed in which a subthreshold leakage current is reduced by increasing the concentration of a channel impurity-doped layer, thereby setting a threshold voltage to higher value.

A semiconductor device has also been proposed in which a short-channel effect is reduced by disposing a pocket impurity-doped layer between a source diffusion layer and a channel region and between a drain diffusion layer and a channel region so as to suppress punch-through between a source and a drain regions, punch-through being accompanied by the short-channel effect.

A semiconductor device has been further proposed in which a junction field between a source/drain region or a region extending therefrom and a channel impurity-doped layer or a pocket impurity-doped layer is reduced by forming the pocket impurity-doped layer to have an overlapping structure, thereby decreasing a junction leakage current. A technique for forming the pocket impurity-doped layer is disclosed in, for example, Japanese Laid-Open Patent Publication No. 2007-173421 and Japanese Laid-Open Patent Publication No. 2007-335704.

Recently, there has been an increasing desire for ultra-low-power consumption, and the further reduction of a junction leakage current has been sought. In addition, there is also a desire for further increasing a driving current and further improving a short-channel effect.

SUMMARY

According to an aspect of the invention, a semiconductor device includes a first pocket region and a second pocket region. The source region includes a first extension region having a concentration peak located at a first depth from a surface of the semiconductor substrate, and the first pocket region has a concentration peak located deeper than the first depth, and the drain region includes a second extension region having a concentration peak located at a second depth from the surface of the semiconductor substrate, and the second pocket region has a concentration peak located shallower than the second depth.

The object and advantages of the invention will be realized and attained by at least the feature, elements, and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 4A, 4B, 5A, 5B, 6A, 6B, 7A, 7B, 8A, 8B, 9A, 9B, 10A, 10B, 11A, 11B, 12A, and 12B illustrate a method of manufacturing a semiconductor device of the first embodiment.

DESCRIPTION OF EMBODIMENTS

A semiconductor device and a method of manufacturing the semiconductor device according to a first embodiment of the present invention is illustrated in FIGS. 1 to 18.

Figure 1:
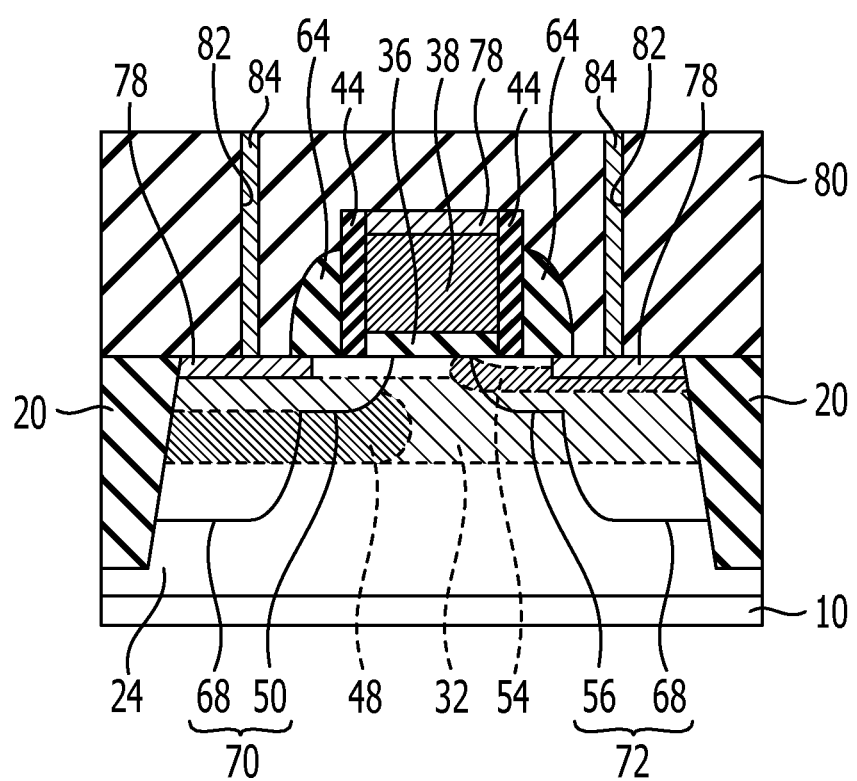
FIG. 1 is a sectional view of a semiconductor device according to a first embodiment of the present invention.
Figure 2:
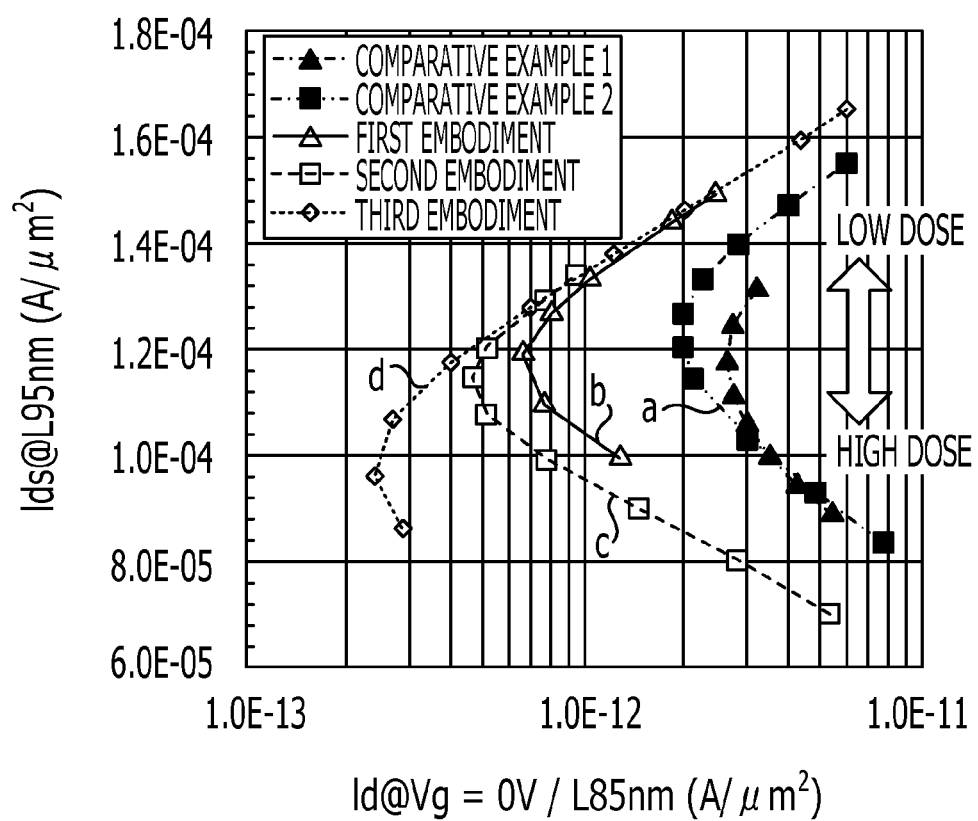
FIG. 2 is a graph illustrating an on-state current and an off-state current of a PMOS transistor when changing the dose in a pocket impurity-doped layer.
Figure 3:
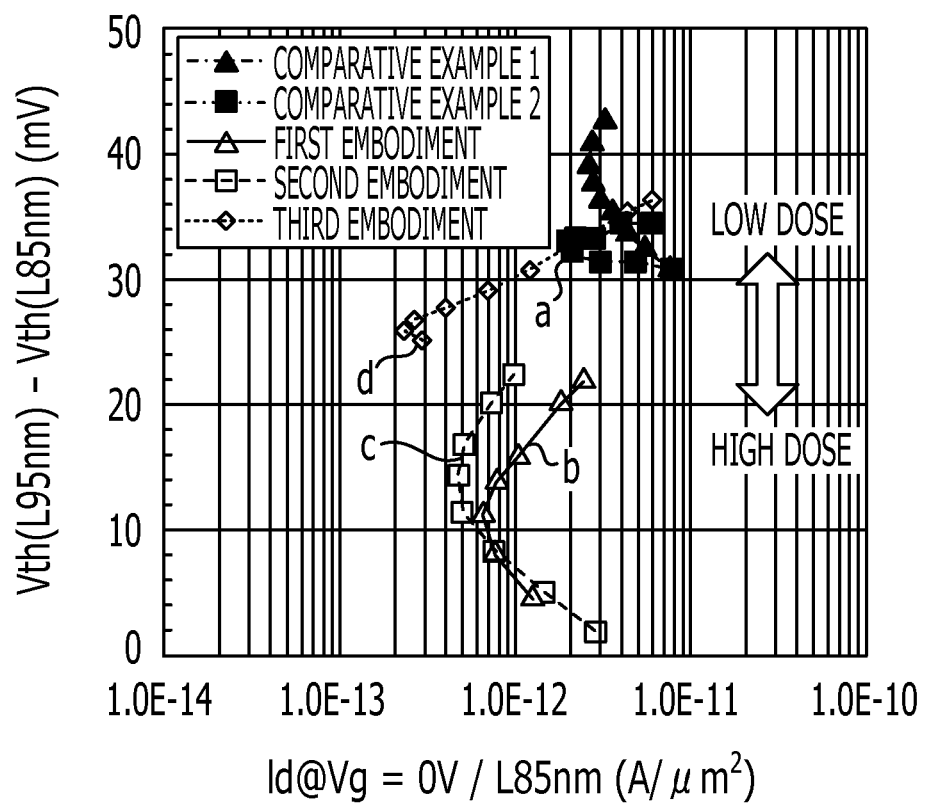
FIG. 3 is a graph illustrating a short-channel effect immunity and an off-state current when changing the dose in a pocket impurity-doped layer.
Figure 13:
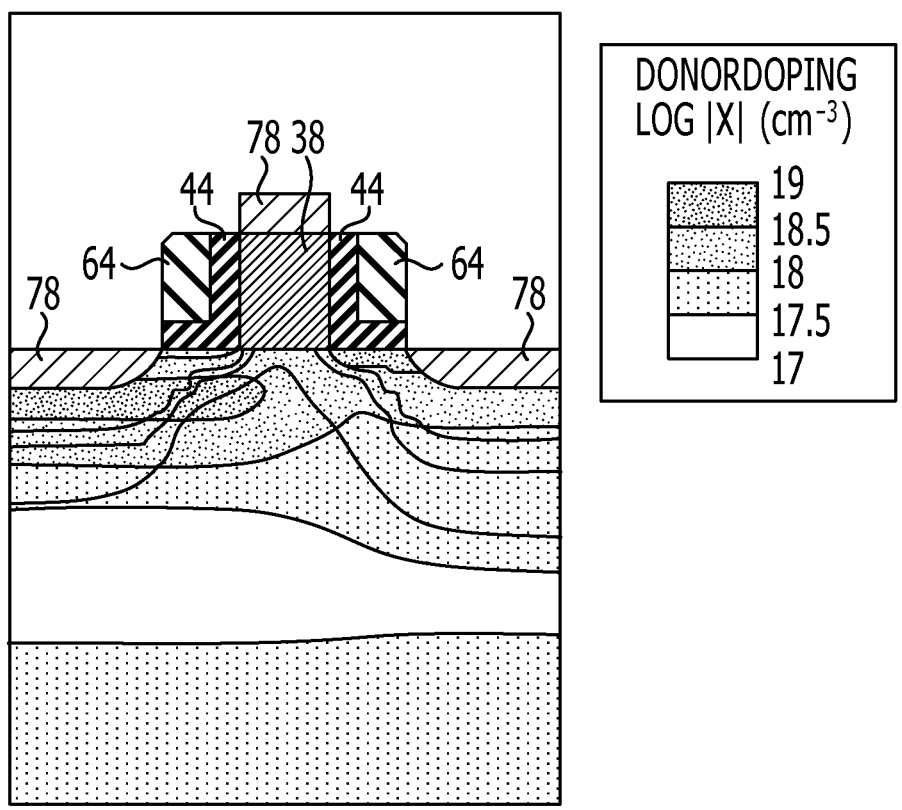
FIG. 13 is a sectional view illustrating a concentration distribution of donor doping in a silicon substrate of a semiconductor device according to the first embodiment.
Figure 14:
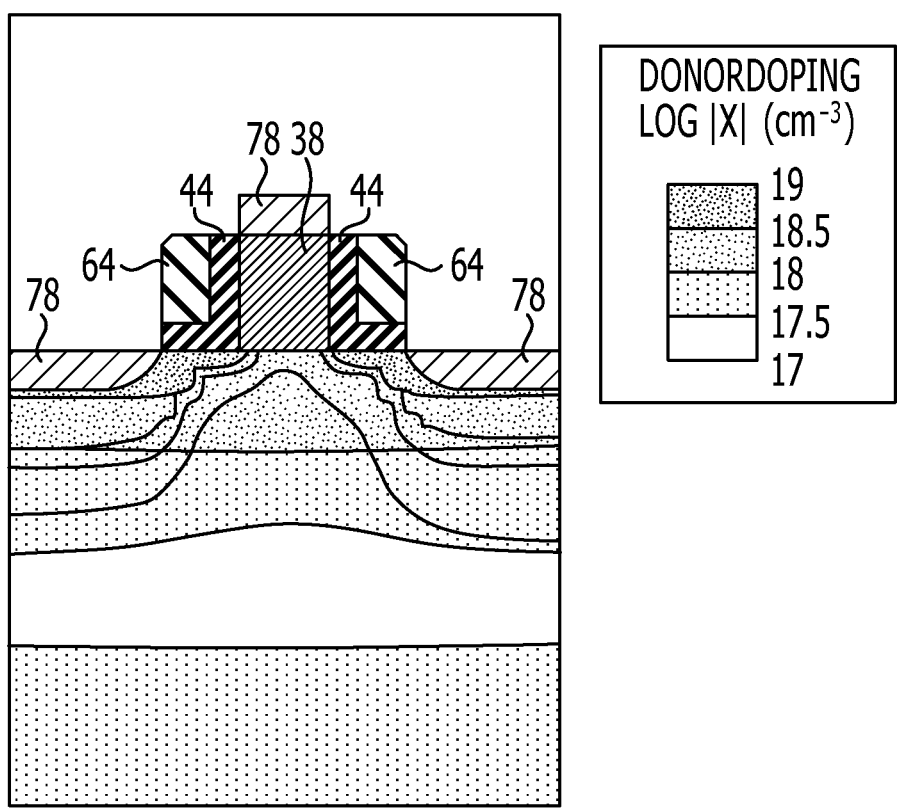
FIG. 14 is a sectional view illustrating a concentration distribution of donor doping in a silicon substrate of a semiconductor device according to a comparative example.
Figure 15:
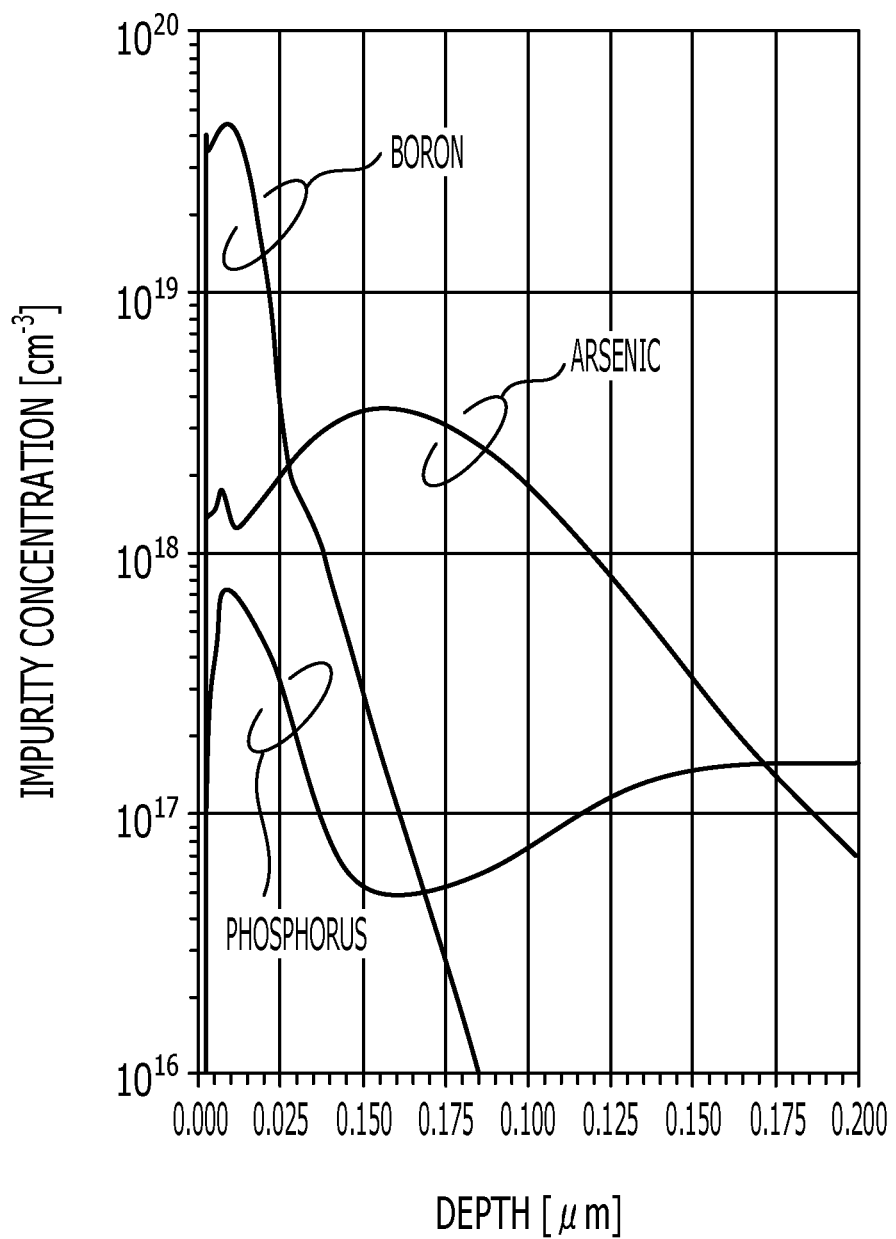
FIG. 15 is a graph illustrating a depth-wise distribution of an impurity concentration in a silicon substrate of a semiconductor device according to the first embodiment.
Figure 16:
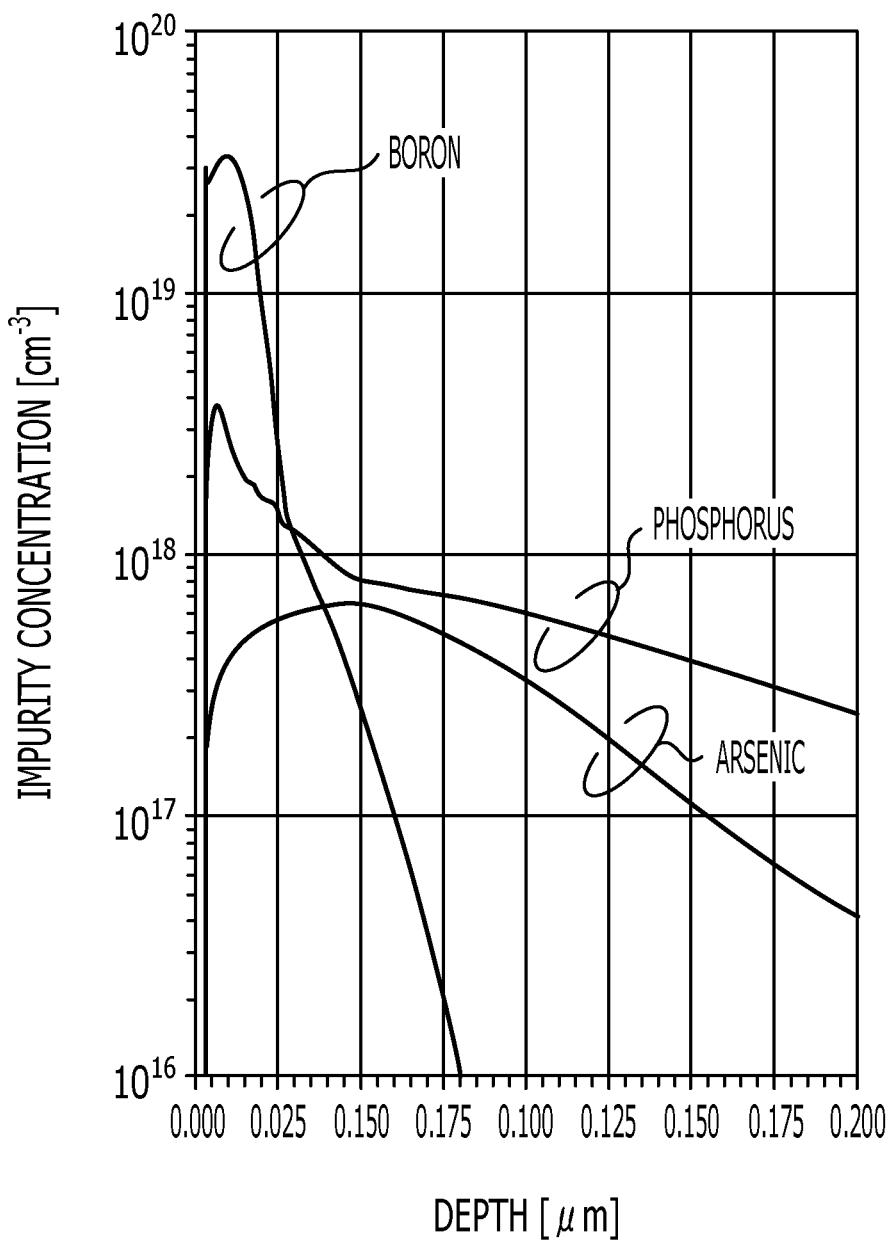
FIG. 16 is a graph illustrating a depth-wise distribution of an impurity concentration in a silicon substrate of a semiconductor device according to the first embodiment.
Figure 17:
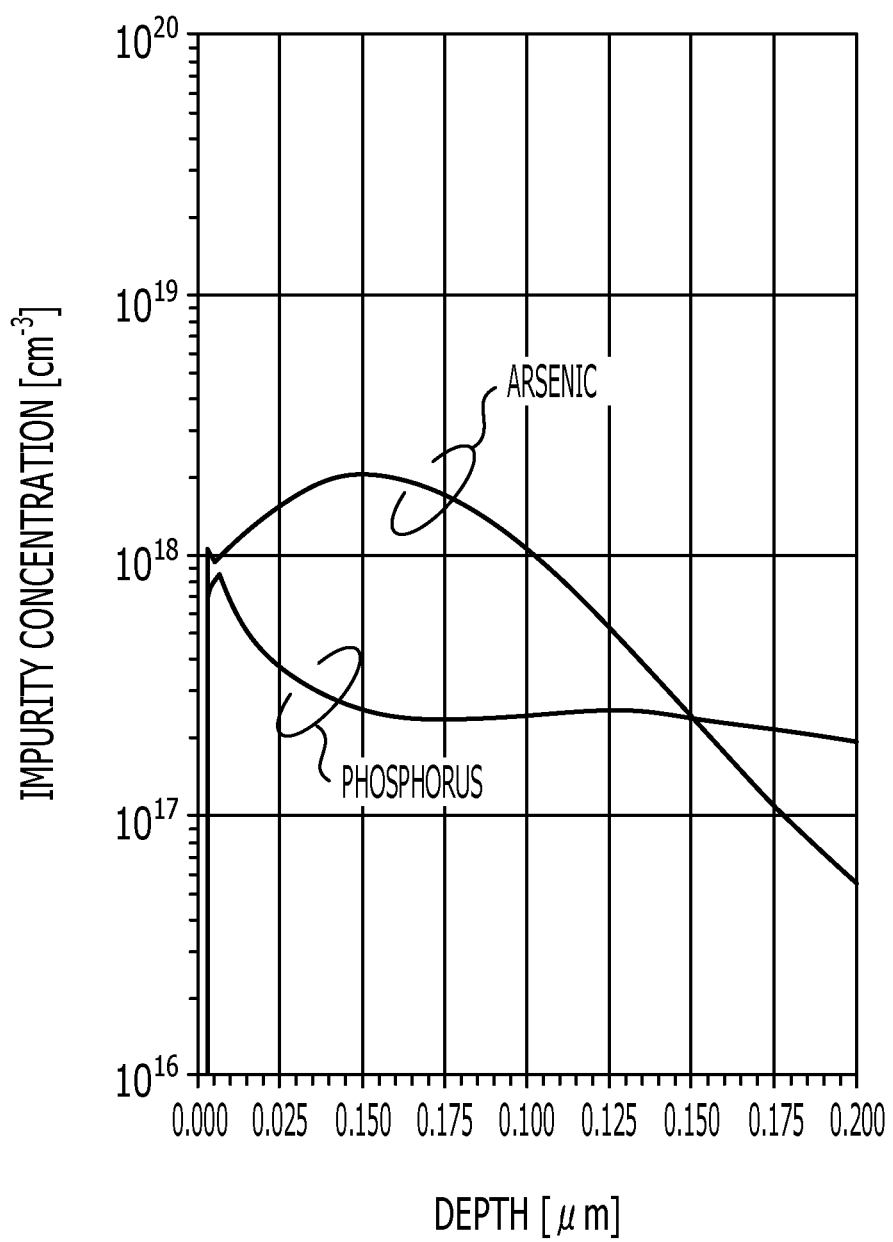
FIG. 17 is a graph illustrating a depth-wise distribution of an impurity concentration in a silicon substrate of a semiconductor device according to the first embodiment.
Figure 18:
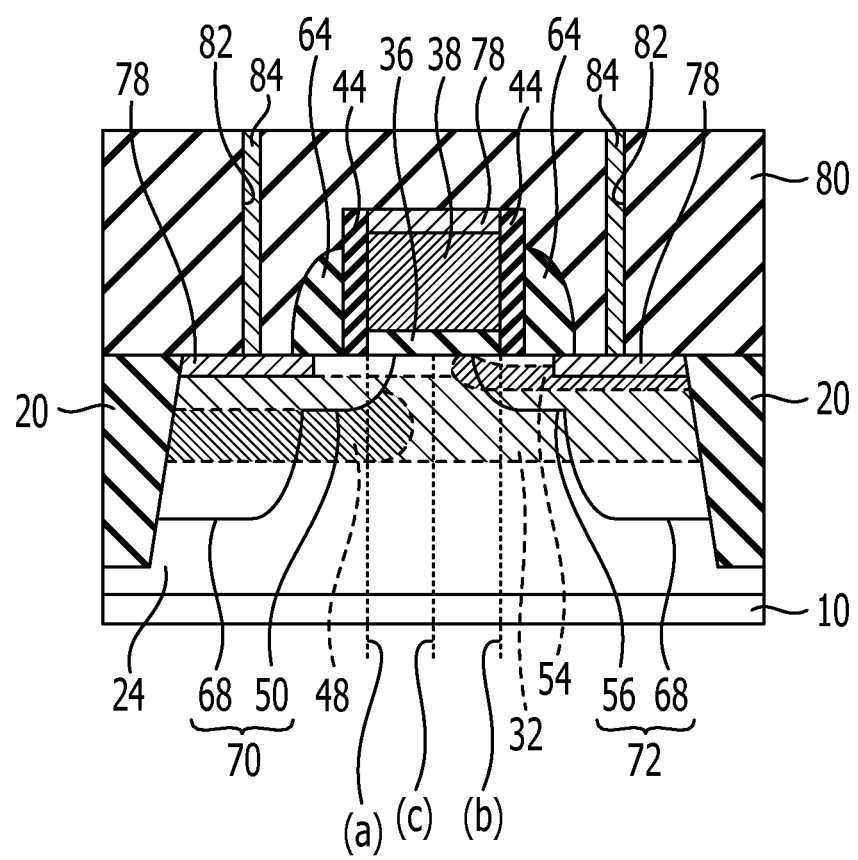
FIG. 18 is a sectional view illustrating the position of the calculated depth-wise distribution of the impurity concentration indicated in each of FIGS. 15 to 17.

FIG. 1 is a sectional view illustrating a semiconductor device according to the first embodiment. FIG. 2 is a graph illustrating an on-state current and an off-state current of a PMOS transistor when changing the dose in a pocket impurity-doped layer. FIG. 3 is a graph illustrating a short-channel effect immunity and an off-state current of a PMOS transistor when changing the dose in a pocket impurity-doped layer. FIGS. 4A to 12B are sectional views illustrating a method of manufacturing a semiconductor device according to the first embodiment. FIG. 13 is a sectional view illustrating results obtained by simulating a concentration distribution of donor doping in a silicon substrate of a semiconductor device according to the first embodiment. FIG. 14 is a sectional view illustrating results obtained by simulating a concentration distribution of donor doping in a silicon substrate of a semiconductor device according to a comparative example. FIGS. 15 to 17 are graphs illustrating results obtained by simulating a depth-wise distribution of an impurity concentration in a silicon substrate of a semiconductor device according to the first embodiment. FIG. 18 is a sectional view illustrating the position of the calculated depth-wise distribution of the impurity concentration indicated in each of FIGS. 15 to 17.

As illustrated in FIG. 1, a shallow trench isolation (STI) 20 that defines a device region is formed in a silicon substrate 10. In the silicon substrate 10 having the device region that is defined by the STI 20, an n-well 24 and a channel impurity-doped layer 32 are formed.

A gate electrode 38 is formed above the silicon substrate 10 having the device region with a gate insulating film 36 therebetween. At the sidewall of the gate electrode 38, side wall spacers 44 and 64 are formed. A metal silicide film 78 is formed on the gate electrode 38.

In the silicon substrate 10 at the source region side of the gate electrode 38, a source diffusion layer 70 and a pocket impurity-doped layer 48 are formed. The source diffusion layer 70 includes an extension impurity-doped layer 50 and an impurity-doped layer 68. The pocket impurity-doped layer 48 has a concentration peak position deeper than that of the extension impurity-doped layer 50. The metal silicide film 78 is formed on the source diffusion layer 70.

A drain diffusion layer 72 and a pocket impurity-doped layer 54 in the silicon substrate 10 are formed together with the gate electrode 38. The drain diffusion layer 72 includes an extension impurity-doped layer 56 and an impurity-doped layer 68. The pocket impurity-doped layer 54 has a concentration peak shallower than that of the extension impurity-doped layer 56 at the drain region side. The metal silicide film 78 is formed on the drain diffusion layer 72.

An insulating interlayer 80 is formed on the silicon substrate 10 having an MIS transistor. In the insulating interlayer 80, contact plugs 84 are formed to reach the metal silicide film 78.

As described above, the MIS transistor included in a semiconductor device according to the first embodiment has the pocket impurity-doped layer 48 that has a concentration peak position deeper than that of the extension impurity-doped layer 50 at the source region side. In addition, at the drain region side, the MIS transistor has the pocket impurity-doped region 54 that has a concentration peak position shallower than that of the extension impurity-doped layer 56.

The concentration of the pocket impurities implanted into the extension impurity-doped layer 50 may be reduced by making the concentration peak position of the pocket impurity-doped layer 48 at the source region side lie deeper than that of the extension impurity-doped region 50. This positioning allows an increase of source resistance to be suppressed, thereby enabling an operating current to become larger. In addition, since the impurity concentration of the pocket impurity-doped layer 48 may be increased while suppressing the effect upon the source resistance, a punch-through immunity between the source and the drain regions may be effectively improved.

An electric field that is generated in a PN-junction positioned underneath the concentration peak position of the impurity-doped layer 56 is reduced by making the concentration peak of the pocket impurity-doped layer 54 at the drain region side form shallower than that of the extension impurity-doped region 56. This positioning allows a junction leakage current to be decreased.

A threshold voltage is decreased by making the concentration peak position of the pocket impurity-doped layer 48 at the source region side lie deeper than that of the extension impurity-doped region 50. Furthermore, the decreasing of the threshold voltage is suppressed by making the pocket impurity-doped layer 54 at the drain region side lie shallower and by allowing the impurity concentration to become higher. These may reduce the subthreshold leakage current and the short-channel effect.

Additionally, such a configuration allows the impurity concentration of the channel impurity-doped layer 32 to be decreased. This makes it possible for the junction leakage current at the drain region side to be further decreased.

FIG. 2 is a graph illustrating a relationship between the off-state current ($I_{off}$) of a PMOS transistor having a gate length L of 85 nm and the on-state current ($I_{on}$) of a PMOS transistor having a gate length L of 95 nm. The PMOS transistor having a shorter gate length is employed for a measurement of the off-state current ($I_{off}$) because the effect on the off-state current ($I_{off}$) becomes larger than that of the PMOS transistor having a longer gate length. Similarly, the PMOS transistor having a longer gate length is employed for a measurement of the on-state current ($I_{on}$) because the effect on the on-state current ($I_{on}$) becomes larger than that of the PMOS transistor having a shorter gate length. In the graph illustrated in FIG. 2, as the off-state current ($I_{off}$) becomes smaller and the on-state current becomes larger (i.e., as the position moves to the upper left corner in this graph), by which is meant a better transistor.

In FIG. 2, the reference symbol "A" denotes characteristics of a semiconductor device according to the first embodiment. A plurality of plotting symbols denote a change in the characteristics caused by changing the dose of the pocket impurity-doped layer 54. The plotting symbol indicated by the reference character "b" denotes characteristics of a semiconductor device manufactured as indicated in the method of manufacture described below in accordance with the first embodiment.

The reference symbols "▲" and "■" denote characteristics of semiconductor devices of comparative examples that have a pocket impurity-doped layer with a symmetric structure in a source region and a drain region. A plurality of plotting symbols indicated by the reference symbol "▲" denote a change in characteristics caused by changing the dose of the pocket impurity-doped layer (Comparative Example 1). A plurality of the plotting symbols indicated by the reference symbol "■" denote a change in characteristics caused by changing the dose of the pocket impurity-doped layer (Comparative Example 2)

As indicated in FIG. 2, at first, as the dose of the pocket impurity-doped layer or the channel impurity-doped layer increases, the on-state current ($I_{on}$) decreases due to an increase in the threshold voltage, and the off-state current ($I_{off}$) decreases due to a decrease in the subthreshold leakage current. The semiconductor device of the first embodiment may reduce the off-state current ($I_{off}$) compared to the semiconductor devices of the comparative examples when the on-state current ($I_{on}$) is the same.

In addition, later, a further increase in the dose of the pocket impurity-doped layer or the channel impurity-doped layer allows the on-state current ($I_{on}$) to be decreased, but allows the off-state current ($I_{off}$) to be increased due to an increase in the junction leakage current. That is, there exists the pocket dose (the dose in the pocket impurity-doped layer) that makes the off-state current ($I_{off}$) minimum. The dose that is used to form the pocket impurity-doped layer may be adjusted appropriately as the off-state current ($I_{off}$) becomes small.

FIG. 3 is a graph illustrating a relationship between a difference between the threshold voltage of a PMOS transistor having a gate length L of 95 nm and that of a PMOS transistor having a gate length L of 85 nm and the off-state current ($I_{off}$) of the PMOS transistor having a gate length L of 85 nm. In FIG. 3, the ordinate provides a parameter that reflects a short-channel effect. That is, data that the difference between the threshold voltage of the PMOS transistor having a gate length L of 95 nm and that of the PMOS transistor having a gate length L of 85 nm is small mean that the roll-off of the threshold voltage is small (i.e., the short-channel effect is small). In FIG. 3, as the off-state current ($I_{off}$) becomes smaller and the short-channel effect becomes smaller (i.e., as the position moves to the lower left corner in this graph), by which is meant a better transistor.

In FIG. 3, the reference symbol "Δ" denotes characteristics of a semiconductor device according to the first embodiment. A plurality of plotting symbols denote a change in the characteristics caused by changing the dose of the pocket impurity-doped layer 54. The plotting symbol indicated by the reference character "b" denotes characteristics of a semiconductor device manufactured as indicated in the method of manufacture described below in accordance with the first embodiment.

The reference symbols "▲" and "■" denote characteristics of semiconductor devices of comparative examples that have a pocket impurity-doped layer with a symmetric structure in a source region and a drain region. The plurality of plotting symbols indicated by the reference symbol "▲" denote a change in characteristics caused by changing the dose of the pocket impurity-doped layer (Comparative Example 1). A plurality of the plotting symbols indicated by the reference symbol "■" denote a change in characteristics caused by changing the dose of the pocket impurity-doped layer (Comparative Example 2)

As indicated in FIG. 3, as the dose of the pocket impurity-doped layer or the channel impurity-doped layer increases, the difference between the threshold voltages decreases in each semiconductor device, thereby suppressing the short-channel effect. In particular, the semiconductor device of the first embodiment greatly reduces the short-channel effect compared to the semiconductor devices of Comparative Examples 1 and 2.

Next, a method of manufacturing a semiconductor device according to the first embodiment is illustrated by using FIGS. 4A to 12B.

The structure of the MIS transistor of the first embodiment as described above may be applied to, but is not limited to, a low-leakage transistor included in a semiconductor device including, for example, a low-leakage transistor, a high-speed transistor, and a high-voltage transistor. As an example, illustrated herein is a method of manufacturing a semiconductor device including three kinds of PMOS transistors that include a p-type low-leakage transistor, a p-type high-speed transistor, and a p-type high-voltage transistor. However, the semiconductor device of the first embodiment is not limited to the PMOS transistor. In the case of an NMOS transistor, use of the impurities having reverse-type conductivity makes the manufacture thereof possible by a similar procedure.

Besides, the term "low-leakage transistor" refers to a transistor equipped in a semiconductor device having a usage represented by a cellular phone or an in-vehicle LSI. Since the threshold voltage is high and the operating current is small, the switching speed is not particularly fast, but the standby power consumption is markedly low.

In addition, the term "high-speed transistor" refers to a transistor equipped in a semiconductor device having a usage represented by, for example, a high-speed processor of a server or a personal computer, and the like. Since the threshold voltage is low and the operating current is large, the switching speed is fast, but the standby leakage current is markedly large so that the power consumption is large.

Further, the term "high-voltage transistor" refers to a transistor for an input/output circuit that is built into an integrated circuit to communicate a signal with the outside. In the part of the input/output circuit, a higher source voltage than that inside the integrated circuit may be supplied.

In each of FIGS. 4A to 12B, the left diagram is a region illustrating formation of a low-leakage transistor. The middle diagram is a region illustrating formation of a high-speed transistor. The right diagram is a region illustrating formation of a high-voltage transistor. On the silicon substrate 10, a silicon oxide film 12 having a film thickness of, for example, 10 nm to 20 nm, or for example, 15 nm is formed by e.g., a thermal oxidation method. The silicon substrate 10 may employ, but is not limited to, a p-type silicon substrate having resistivity of 10 Ω·cm to 15 Ω·cm, or for example, 10 Ω·cm.

In FIG. 4A, on the silicon oxide film 12, a silicon nitride film 14 having a film thickness of, for example, 90 nm to 140 nm, or for example, 110 nm is formed by e.g., chemical vapor deposition (CVD).

A photoresist film (not illustrated) that exposes an expected region for STI formation is formed by photolithography.

The silicon nitride film 14 and the silicone oxide film 12 are etched by using the photoresist film as a mask, and the expected regions of the silicon nitride film 14 and the silicone oxide film 12 for STI formation are removed.

The silicon substrate 10 is dry etched by using the photoresist film as a mask, so that on the surface the silicon substrate 10, a device separation trench 16 having a depth of, for example, 260 nm to 380 nm, or for example, 320 nm is formed.

In FIG. 4B, the photoresist film (not illustrated) is removed by e.g., ashing.

Figure 5A:
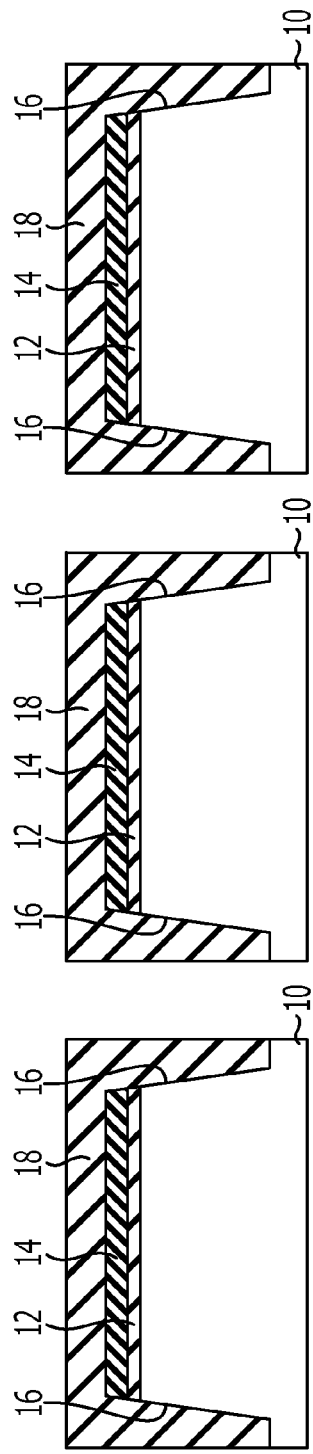

In FIG. 5A, a silicon oxide film 18 that covers the device separation trench 16 is formed on all the surfaces by e.g., a CVD method.

Figure 5B:
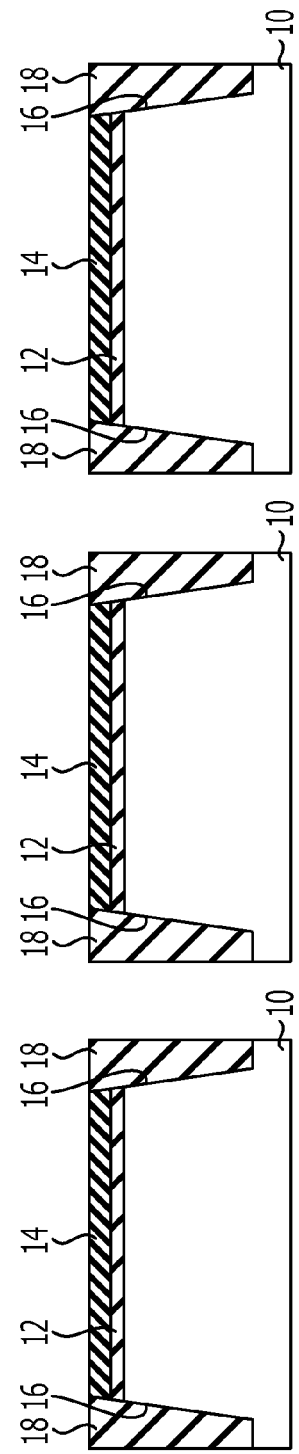

In FIG. 5B, the surface of the silicon oxide 18 is planarized by e.g., chemical mechanical polishing (CMP), and the surface of the silicon nitride 14 is exposed.

The silicon nitride film 14 and the silicon oxide film 12 are removed by e.g., dry etching.

Figure 6A:
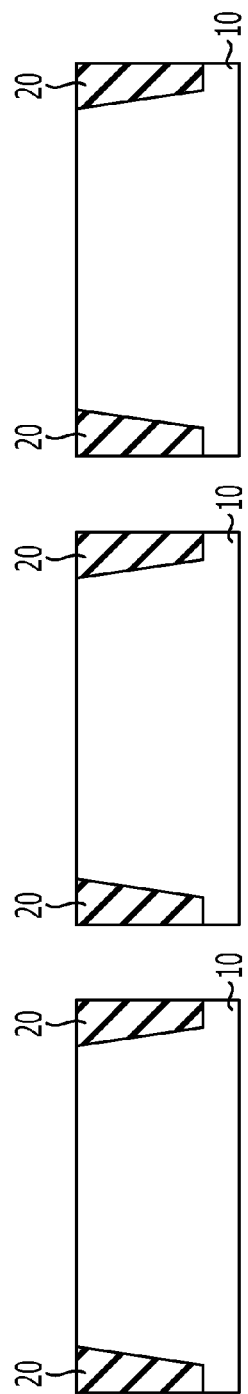

As illustrated in FIG. 6A, a STI 20 that is built by the silicon oxide film 18 buried in the device separation trench 16 is formed by an STI method in such a manner.

On the device region of the silicon substrate 10 that is defined by the STI 20, a silicon oxide film having a film thickness of, for example, 10 nm to 15 nm, or for example, 10 nm is grown by e.g., a thermal oxidation method to form a sacrificial oxidation film 22 composed of a silicon oxide film.

The PMOS transistor-forming region is exposed by photolithography from a photoresist film (not illustrated) that covers the rest of the region.

An n-type impurity is ion implanted by using this photoresist film as a mask to form an n-well 24 in the PMOS transistor-forming region of the silicon substrate 10. The condition of the ion implantation is described as follows: phosphorus ions ($P^+$), for example, are used as the n-type impurity; the acceleration energy is set to, for example, 360±30 keV, or for example, 360 keV; the dose is set to $3 \times 10^{13}$ cm$^{-2}$±10%, or for example, $3 \times 10^{13}$ cm$^{-2}$. The inclination angle (tilt angle) of the substrate to the incident ion implantation beam is, for example, 0 degrees.

However, the n-well 24 is not necessarily to be formed. This case, for example, may employ an n-type silicon substrate instead of the p-type silicon substrate. The well may be considered herein as a part of a semiconductor substrate, and may be called a semiconductor substrate as a whole.

The photoresist film is removed by e.g., ashing.

The p-type high-voltage transistor-forming region is exposed by photolithography to form a photoresist film 26 that covers the rest of the region.

Figure 6B:
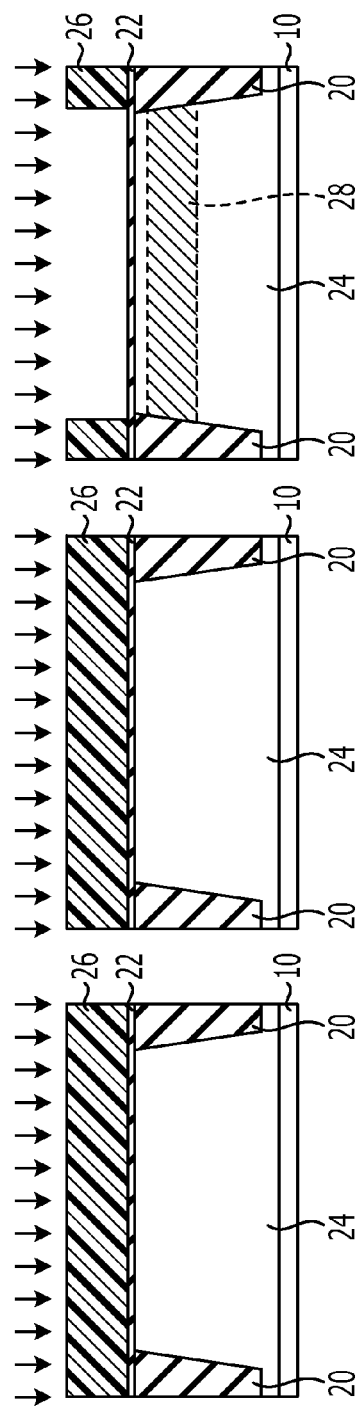

In FIG. 6B, an n-type impurity are ion implanted by using the photoresist film 26 as a mask to form a channel impurity-doped layer 28 in the p-type high-voltage transistor-forming region of the silicon substrate 10. The condition of the ion implantation is described as follows: arsenic ions ($As^+$), for example, are used as the n-type impurity; the acceleration energy is set to, for example, 150±30 keV, or for example, 150 keV; the dose is set to, for example, $3 \times 10^{12}$ cm$^{-2}$±10%, or for example, $3 \times 10^{12}$ cm$^{-2}$. The tilt angle is, for example, 7 degrees.

The photoresist film 26 is removed by e.g., ashing. The p-type low-leakage transistor-forming region and the p-type high-speed transistor-forming region are exposed by photolithography to form a photoresist film 30 that covers the rest of the region.

Figure 7A:
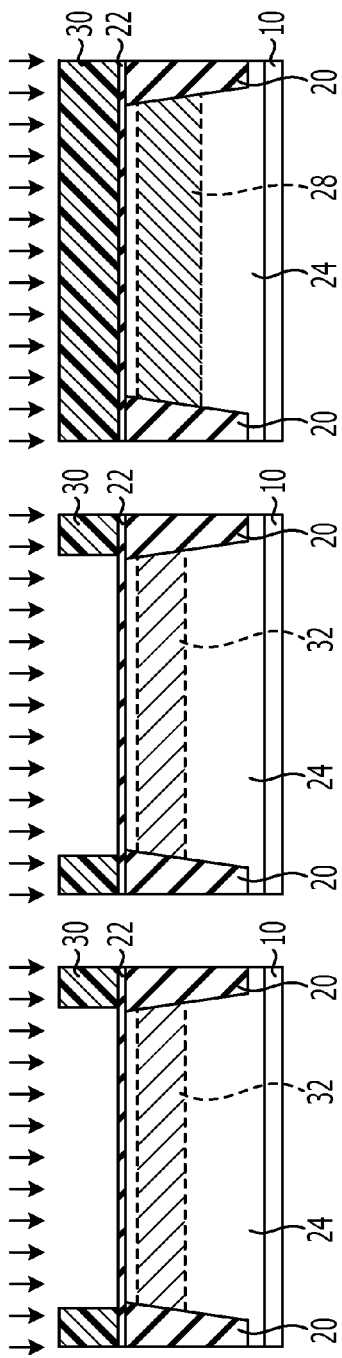

In FIG. 7A, an n-type impurity is ion implanted by using the photoresist film 30 as a mask to form a channel impurity-doped layer 32 in the p-type low-leakage transistor-forming region and the p-type high-speed transistor-forming region of the silicon substrate 10. The condition of the ion implantation is described as follows: arsenic ions ($As^+$), for example, are used as the n-type impurity; the acceleration energy is set to, for example, 100±30 keV, or for example, 100 keV; the dose is set to, for example, $3 \times 10^{12}$ cm$^{-2}$±20%, or for example, $3 \times 10^{12}$ cm$^{-2}$. The tilt angle is, for example, 7 degrees.

The photoresist film 30 is removed by e.g., ashing.

Under a nitrogen atmosphere, a short-term anneal having a duration of 10±3 sec is performed at, for example, 1000±10° C. to activate the implanted impurities.

The sacrificial oxidation film 22 is removed by e.g., wet etching using a hydrofluoric acid aqueous solution.

On the surface of the silicon substrate 10 that has the P-type high-voltage transistor-forming region, a silicon oxide film having a film thickness of, for example, 7.0±0.3 nm, is grown to form a gate insulating film 34 composed of a silicon oxide film.

The gate insulating film 34 that is formed on p-type low-leakage transistor-forming region and the p-type high-speed transistor-forming region is removed by photolithography and wet etching.

Figure 7B:
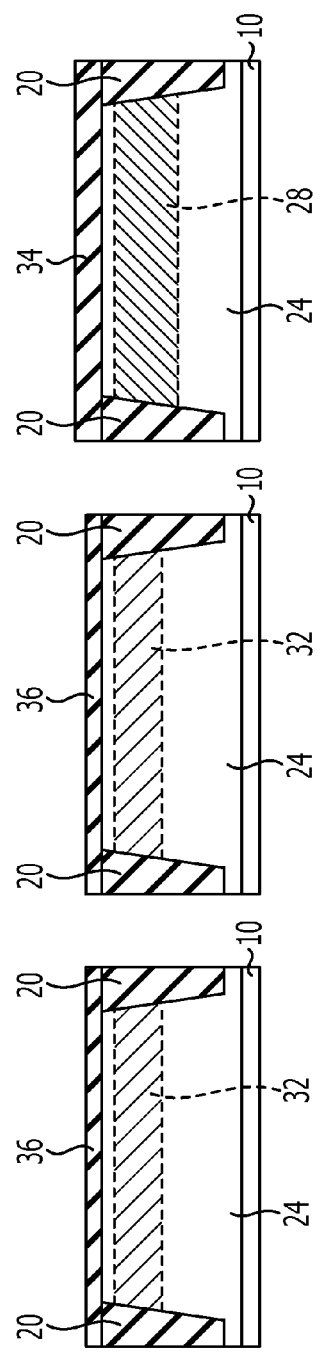

In FIG. 7B, on the surface of the silicon substrate 10 that has the p-type low-leakage transistor-forming region and the p-type high-speed transistor-forming region, a silicon oxide film having a film thickness of, for example, 2.3±0.1 nm, is grown to form a gate insulating film 36 composed of a silicon oxide film.

A polycrystalline silicon film having a film thickness of, for example, 110±15 nm is deposited at, for example, 600±10° C. by e.g., a CVD method.

Figure 8A:
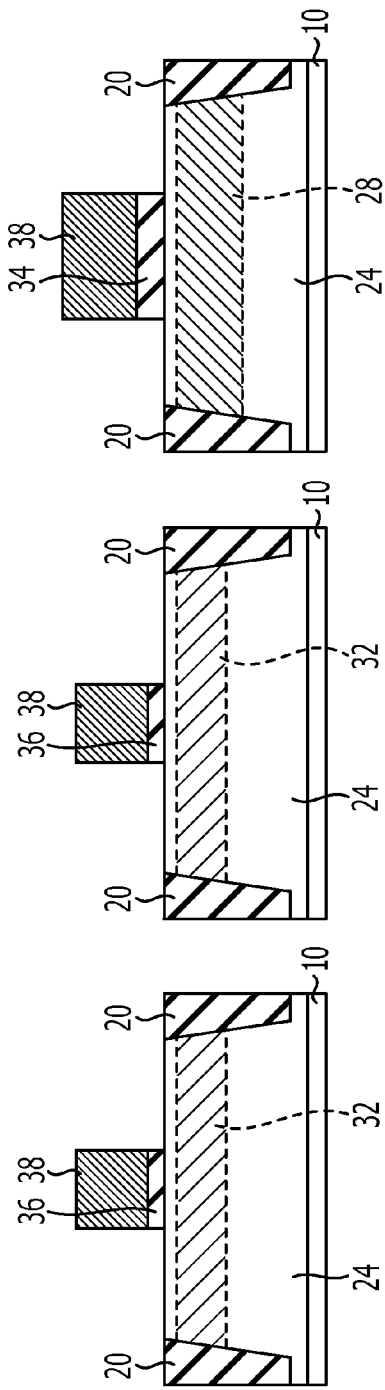

In FIG. 8A, this polycrystalline silicone film is patterned by photolithography and dry etching, and a gate electrode 38 is formed over each transistor-forming region.

The p-type high-voltage transistor-forming region is exposed by photolithography to form a photoresist film 40 that covers the rest of the region.

Figure 8B:
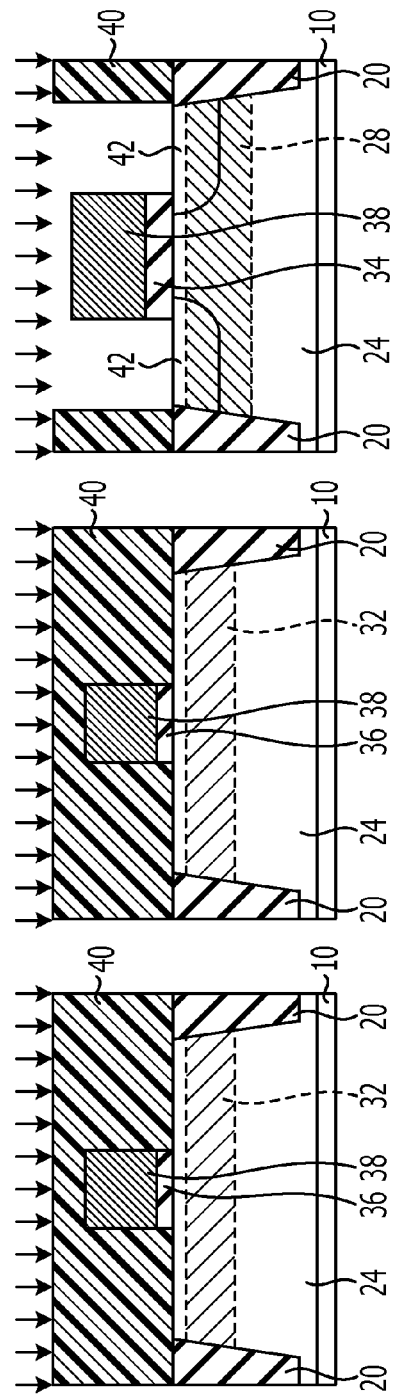

In FIG. 8B, a p-type impurity is ion implanted by using the photoresist film 40 and the gate electrode 38 as a mask to form an impurity-doped layer 42 that becomes an extension region of a source/drain diffusion layer of the p-type high-voltage transistor in the p-type high-voltage transistor-forming region. The condition of the ion implantation is described as follows: boron difluoride ions ($BF_2^+$), for example, are used as the p-type impurity; the acceleration energy is set to, for example, 10±3 keV, or for example, 10 keV; the dose is set to, for example, $4 \times 10^{13}$ cm$^{-2}$±10%, or for example, $4 \times 10^{13}$ cm$^{-2}$. The tilt angle is, for example, 0 degrees.

The photoresist film 40 is removed by e.g., ashing. A silicon nitride film having a film thickness of, for example, 10±2 nm, or for example, 10 nm is formed at a film-forming temperature of, for example, 650±20° C., or for example, 650° C. by e.g., a CVD method.

In FIG. 9A, etching back this silicon nitride film makes a portion of the side wall of the gate electrode 38 remain the same selectively to form a side wall spacer 44 composed of a silicon nitride film.

In FIG. 9B, the source region of the p-type low-leakage transistor is exposed by photolithography from a photoresist film 46 that covers the rest of the region.

An n-type impurity is ion implanted by using the photoresist film 46, the gate electrode 38, and the sidewall spacer 44 as a mask to form a pocket impurity-doped layer 48 in a deep position in the source region of the p-type low-leakage transistor. The condition of the ion implantation is described as follows: arsenic ions ($As^+$), for example, are used as the n-type impurity; the acceleration energy is set to, for example, 40±10 keV, or for example, 40 keV; the dose is set to $3.0 \times 10^{13}$ cm$^{-2}$±10%, or for example, $3.0 \times 10^{13}$ cm$^{-2}$. The tilt angle is, for example, 30±3 degrees, or for example, 30 degrees. In this occasion, the fact that there are transistors disposed in different directions is taken into consideration, and the ions with the dose of $7.5 \times 10^{12}$ cm$^{-2}$ are ion implanted in each of four directions tilted toward the ±X axis and the ±Y axis to the substrate normal.

In FIG. 9B, a p-type impurity is ion implanted by using the photoresist film 46, the gate electrode 38, and the sidewall spacer 44 as a mask to form an impurity-doped layer 50 that becomes an extension region of the source diffusion layer in the source region of the p-type low-leakage transistor. The condition of the ion implantation is described as follows: boron ions (B$^+$), for example, are used as the p-type impurity; the acceleration energy is set to, for example, 0.5±0.2 keV, or for example, 0.5 keV; the dose is set to, for example, 1.0×10$^{15}$ cm$^{-2}$±10%, or for example, 1.0×10$^{15}$ cm$^{-2}$. The tilt angle is, for example, 0 degrees.

In addition, either the pocket impurity-doped layer 48 or the impurity-doped layer 50 may be formed first. When the pocket impurity-doped layer 48 and the impurity-doped layer 50 are formed, the condition of the ion implantation is adjusted appropriately as the position of the concentration peak position of the pocket impurity-doped layer 48 becomes deeper than that of the impurity-doped layer 50. Besides, the pocket impurity-doped layer 48 and the impurity-doped layer 50 may be formed before the formation of the sidewall spacer 44 in a manner similar to the impurity-doped layer 42.

The photoresist film 46 is removed by e.g., ashing. The drain region of the p-type low-leakage transistor is exposed by photolithography from a photoresist film 52 that covers the rest of the region.

Figure 10A:
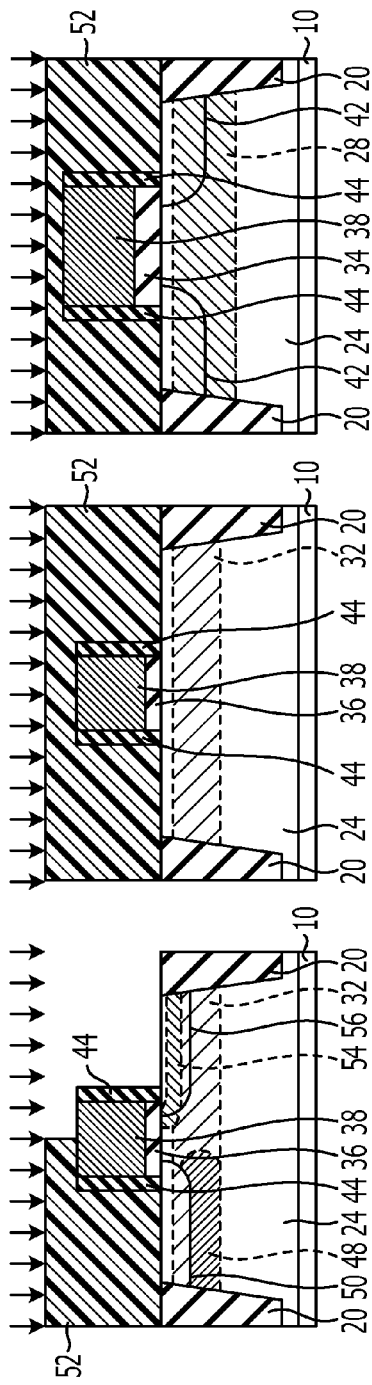

In FIG. 10A, an n-type impurity is ion implanted by using the photoresist film 52, the gate electrode 38, and the sidewall spacer 44 as a mask to form a pocket impurity-doped layer 54 located shallower in the drain region of the p-type low-leakage transistor. The condition of the ion implantation is described as follows: phosphorus ions (P$^+$), for example, are used as the n-type impurity; the acceleration energy is set to, for example, 25±10 keV, or for example, 25 keV; the dose is set to 4.8×10$^{13}$ cm$^{-2}$+10%, or for example, 4.8×10$^{13}$ cm$^{-2}$. The tilt angle is, for example, 30±3 degrees, or for example, 30 degrees. In this occasion, the fact that there are transistors disposed in different directions is taken into consideration, and the ions with the dose of 1.2×10$^{13}$ cm$^{-2}$ are ion implanted in each of four directions tilted toward the ±X axis and the ±Y axis to the substrate normal.

As illustrated in FIG. 10A, a p-type impurity is ion implanted by using the photoresist film 52, the gate electrode 38, and the sidewall spacer 44 as a mask to form an impurity-doped layer 56 that becomes an extension region of the drain diffusion layer in the drain region of the p-type low-leakage transistor. The condition of the ion implantation may use the same condition as for the impurity-doped layer 50 that is formed in the source region side.

In addition, either the pocket impurity-doped layer 54 or the impurity-doped layer 56 may be formed first. When the pocket impurity-doped layer 54 and the impurity-doped layer 56 are formed, the condition of the ion implantation is adjusted appropriately as the concentration peak position of the pocket impurity-doped layer 54 becomes shallower than that of the impurity-doped layer 56. Besides, the pocket impurity-doped layer 54 and the impurity-doped layer 56 may be formed before the formation of the sidewall spacer 44 in a manner similar to the impurity-doped layer 42.

The photoresist film 52 is removed by e.g., ashing. The p-type high-speed transistor-forming region is exposed by photolithography from a photoresist film 58 that covers the rest of the region.

Figure 10B:
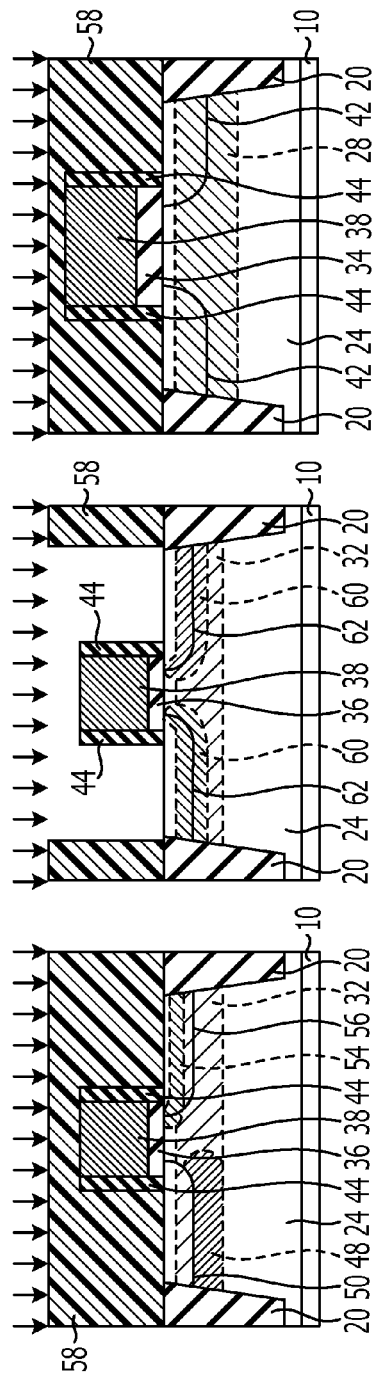

In FIG. 10B, an n-type impurity is ion implanted by using the photoresist film 58, the gate electrode 38, and the sidewall spacer 44 as a mask to form a pocket impurity-doped layer 60 in the source/drain regions of the p-type high-speed transistor. The condition of the ion implantation is described as follows: phosphorus ions (P$^+$), for example, are used as the n-type impurity; the acceleration energy is set to, for example, 25±10 keV, or for example, 25 keV; the dose is set to 3.8×10$^{13}$ cm$^{-2}$+10%, or for example, 3.8×10$^{13}$ cm$^{-2}$. The tilt angle is, for example, 30+3 degrees, or for example, 30 degrees. In this occasion, the fact that there are transistors disposed in different directions is taken into consideration, and the ions with the dose of 9.6×10$^{12}$ cm$^{-2}$ are ion implanted in each of four directions tilted toward the ±X axis and the ±Y axis to the substrate normal.

In FIG. 10B, a p-type impurity are ion implanted by using the photoresist film 58, the gate electrode 38, and the sidewall spacer 44 as a mask to form an impurity-doped layer 62 that becomes an extension region of the source/drain diffusion layers in the source/drain regions of the p-type high-speed transistor. The condition of the ion implantation may use the same condition as for the impurity diffusion layers 50 and 56 of the p-type low-leakage transistor.

In addition, either the pocket impurity-doped layer 60 or the impurity-doped layer 62 may be formed first.

The photoresist film 58 is removed by e.g., ashing. A silicon oxide film having a film thickness of, for example, 90±10 nm, or for example, 90 nm is formed at a film-forming temperature of, for example, 620±20° C., or for example, 620° C. by e.g., a CVD method.

Figure 11A:
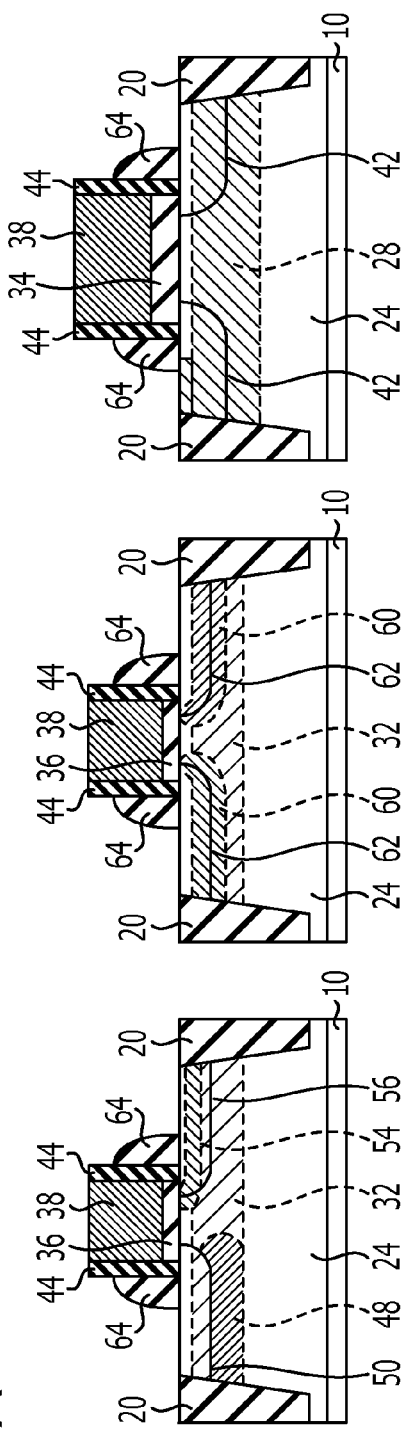

In FIG. 11A, etching back this silicon oxide film allows a sidewall spacer 64 composed of a silicon oxide film having a width of, for example, 80±20 nm, or for example, 80 nm to be formed at the portion of the sidewall of the gate electrode 38 that forms the sidewall spacer 44 on its side.

Each PMOS transistor-forming region is exposed by photolithography to form a photoresist film 66 that covers the rest of the region.

Figure 11B:
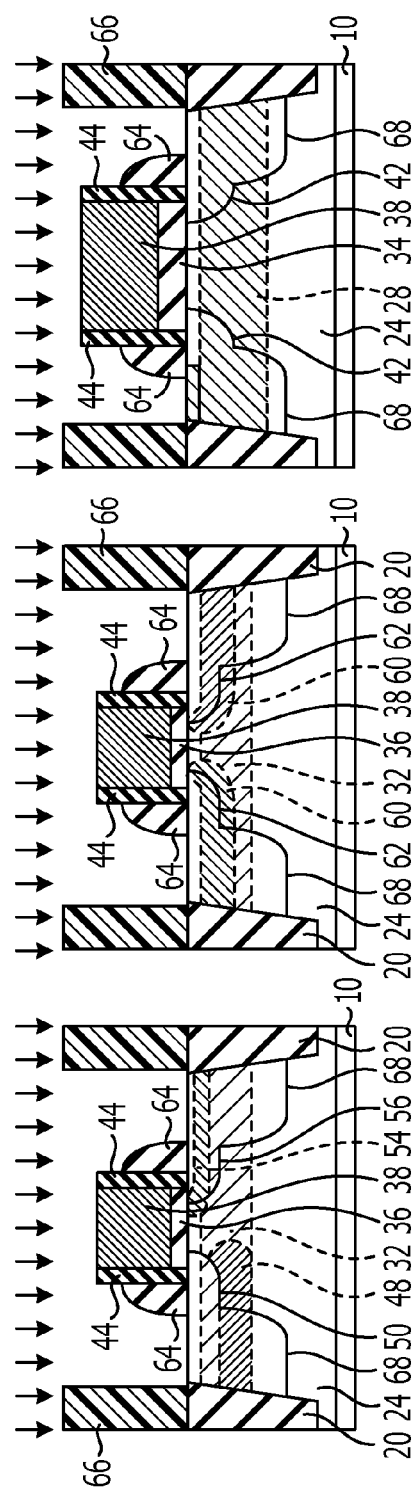

In FIG. 11B, a p-type impurity is ion implanted by using the photoresist film 66, the gate electrode 38, and the sidewall spacers 44 and 46 as a mask to form a impurity-doped layer 68 that becomes source/drain diffusion regions in each PMOS transistor-forming region. The impurity-doped layer 68 may be formed, but is not limited to, by two times of the ion implantation having, for example, a different acceleration energy and dose. The condition of the first ion implantation is described as follows: boron ions (B$^+$), for example, are used as the p-type impurity; the acceleration energy is set to, for example, 8±1 keV, or for example, 8 keV; the dose is set to, for example, 1.0×10$^{13}$ cm$^{-2}$±10%, or for example, 1.0×10$^{13}$ cm$^{-2}$. The tilt angle is, for example, 0 degrees. The condition of the second ion implantation is described as follows: boron ions (B$^+$), for example, are used as the p-type impurity; the acceleration energy is set to, for example, 4±1 keV, or for example, 4 keV; the dose is set to, for example, 4.0×10$^{15}$ cm$^{-2}$±10%, or for example, 4.0×10$^{15}$ cm$^{-2}$. The tilt angle is, for example, 0 degrees.

The photoresist film 66 is removed by e.g., ashing.

Under a nitrogen atmosphere, a short-term anneal having a duration of, for example, 2 to 7 sec, or for example, 3 sec is performed at, for example, 1050±30° C., or for example, 1050° C. to activate the implanted impurities.

In such a manner, a source diffusion layer 70 having the impurity-doped layers 50 and 68 is formed in the source region of the p-type low-leakage transistor. A drain diffusion layer 72 having the impurity-doped layers 56 and 68 is also formed in the drain region of the p-type low-leakage transistor. In addition, source/drain diffusion layers 74 having the impurity-doped layers 62 and 68 are formed in the source/drain regions of the p-type high-speed transistor. Further, source/drain diffusion layers 76 having the impurity-doped layers 42 and 68 are formed in the source/drain regions of the p-type high-voltage transistor.

Figure 12A:
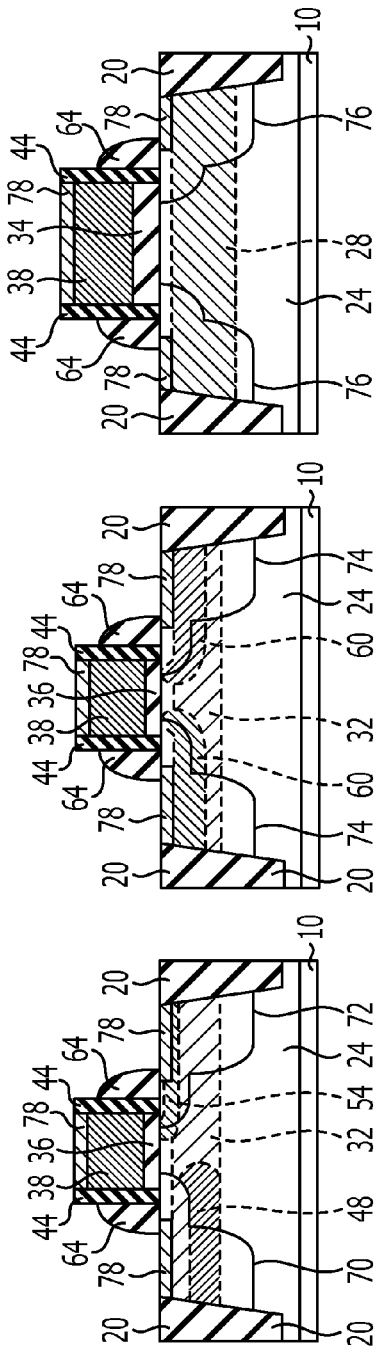

In FIG. 12A, a metal silicide film 78 composed of cobalt silicide having a film thickness of, for example, 30 nm is formed on the gate electrode 38 and source/drain diffusion layers 70, 72, 74, and 76 by a salicide process.

Figure 12B:
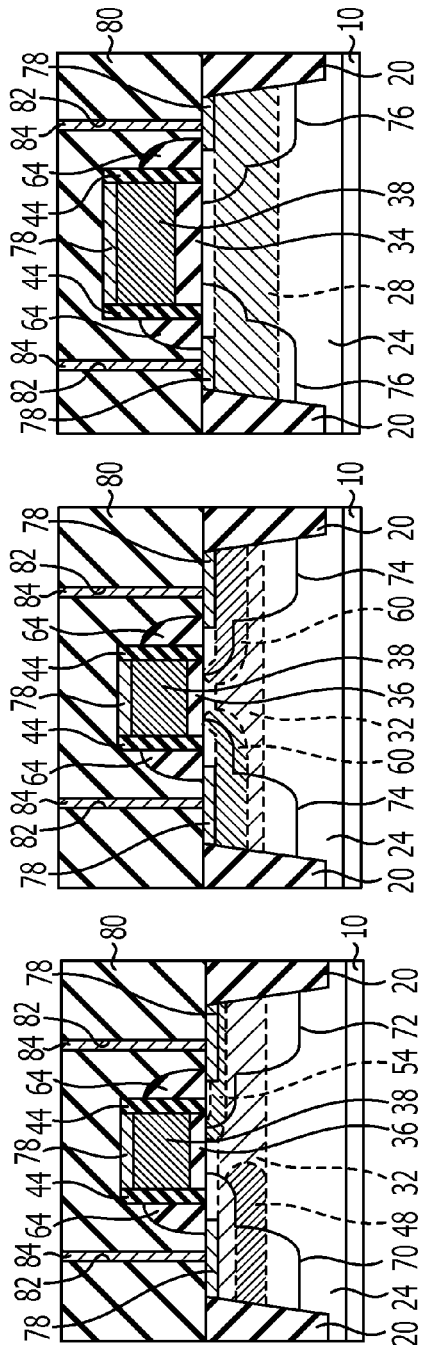

In FIG. 12B, a silicon nitride film having a film thickness of, for example, 80 nm, and USG and TEOS films having a film thickness of, for example, 145 nm are deposited as an etching stopper by e.g., a CVD method to form an insulating interlayer 80 that is a laminate film composed of the above films.

Contact holes 82 that reach to the metal silicide film 78 are formed in the insulating interlayer 80 by photolithography and dry etching.

In FIG. 12B, Ti and TiN films having a film thickness of 14 nm are deposited as a glue layer by e.g., a sputtering technique. A tungsten film having a film thickness of 200 nm is deposited by e.g., a CVD method. Then, these conductive films on the insulating interlayer 80 are removed by a CMP method. By this procedure, contact plugs 84 that are filled in the contact hole 82 are formed.

After this, the formation of other devices and the back-end process may be carried out, and a semiconductor device of the first embodiment is manufactured.

FIG. 13 is a sectional view illustrating results obtained by simulating a two-dimensional concentration distribution of donor doping in a silicon substrate in respect to the p-type low-leakage transistor manufactured as indicated in the above method in accordance with the first embodiment.

As a comparative example, FIG. 14 illustrates a result that performs a similar simulation regarding the PMOS transistor having pocket regions with a symmetric structure in the source region and the drain region. In the PMOS transistor used in the simulation in FIG. 14, arsenic ions are ion implanted by using the condition having the acceleration energy of 100 keV, the dose of $1.5 \times 10^{13}$ cm$^{-2}$, and the tilt angle of 7 degrees to form a channel impurity-doped layer 32. Except the above condition, the procedure is identical to that of the p-type high-speed transistor described above. In addition, the characteristics of the PMOS transistor formed by this condition are denoted by the plotting symbol "a" in FIGS. 2 and 3.

As illustrated in FIG. 13, the p-type low-leakage transistor of the first embodiment has a concentration peak of donor doping in a deep position at the source region side because the pocket impurity-doped layer 48 is formed in a deep position. In addition, the transistor has a concentration peak of donor doping in a shallow position at the drain region side because the pocket impurity-doped layer 54 is formed in a shallow position. These concentration peak positions are located at a deep position for the source region side and located at a shallow position for the drain region side compared to the profile of the donor doping of the PMOS transistor illustrated in FIG. 14.

FIGS. 15 to 17 show results obtained by simulating a depth-wise distribution of an impurity concentration in the silicon substrate 10 in respect to the p-type low-leakage transistor manufactured as indicated in the above method in accordance with the first embodiment. FIG. 15 is a graph illustrating results obtained by simulating a depth-wise distribution underneath the source region side of the end of the gate electrode 38. It illustrates an impurity concentration distribution taken along the dotted line (a) of FIG. 18. FIG. 16 is a graph illustrating results obtained by simulating a depth-wise distribution underneath the drain region side of the end of the gate electrode 38. It illustrates an impurity concentration distribution taken along the dotted line (b) of FIG. 18. FIG. 17 is a graph illustrating results obtained by simulating a depth-wise distribution underneath the center point of the gate electrode 38. It illustrates an impurity concentration distribution taken along the dotted line (c) of FIG. 18.

In FIGS. 15 to 17, the line denoted by the reference word "Arsenic" illustrates an impurity concentration distribution of the pocket impurity-doped layer 48, and the line denoted by the reference word "Phosphorus" illustrates an impurity concentration distribution of the pocket impurity-doped layer 54. In addition, in FIG. 15, the line denoted by the reference word "Boron" illustrates an impurity concentration distribution of the extension impurity-doped layer 50 at the source region side. Besides, in FIG. 16, the line denoted by the reference word "Boron" illustrates an impurity concentration distribution of the extension impurity-doped layer 50 at the drain region side.

As illustrated in FIG. 15, the concentration peak position of the impurity-doped layer 48 lies deeper than that of the extension impurity-doped layer 50 in the source diffusion layer. In addition, as illustrated in FIG. 15, the concentration peak position of the impurity-doped layer 54 lies shallower than that of the extension impurity-doped layer 56 in the drain diffusion layer.

The above results of the simulation verify that the concentration peak position of the pocket impurity-doped layer 48 may be positioned deeper than that of the extension impurity-doped layer 50 in respect to the p-type low-leakage transistor manufactured as indicated in the above method in accordance with the first embodiment. Besides, the results also verify that the concentration peak position of the pocket impurity-doped layer 54 may be positioned shallower than that of the extension impurity-doped layer 56. In addition, as illustrated in FIGS. 2 and 3, employing such an impurity profile allows a MIS transistor in which a driving current is large and a leakage current is small to be built.

As described above, according to the first embodiment, the pocket impurities implanted into the extension impurity-doped layer may be reduced by forming the pocket impurity-doped layer, the concentration peak of which is positioned deeper than that of the extension impurity-doped layer at the source region side. This allows an increase in the source resistance to be suppressed, thereby increasing the driving current. In addition, since the impurity concentration of the pocket impurity-doped layer may be increased while suppressing the effect upon the source resistance, a punch-through immunity between the source and the drain regions may be effectively improved.

The pocket impurity-doped layer that has a concentration peak position shallower than that of the extension impurity-doped layer at the drain region side is also formed. Accordingly, the electric field that is generated in the PN-junction located underneath the concentration peak position of the extension impurity-doped layer may be reduced. This allows a junction leakage current between the drain diffusion layer and the substrate to be decreased.

A decrease of the threshold voltage caused by making the concentration peak position of the pocket impurity-doped layer at the source region side lie deeper than that of the extension impurity-doped region may be suppressed by making the pocket impurity-doped layer at the drain region side lie shallower and by allowing the impurity concentration to become higher. These allow the subthreshold leakage current and the short-channel effect to be reduced.

Additionally, such a configuration allows the impurity concentration of the channel impurity-doped layer to be decreased. This may further decrease a junction leakage current between the drain diffusion layer and the substrate.

A semiconductor device and a method of manufacturing the semiconductor device according to a second embodiment of the present invention is illustrated by using FIGS. 19 to 25. The same numbering is used for the constituents identical to those of the semiconductor device and the method of manufacturing the semiconductor device according to the first embodiment illustrated in FIGS. 1 to 18. Accordingly, the explanation is omitted, and the numbering makes the explanation simple.

Figure 19:
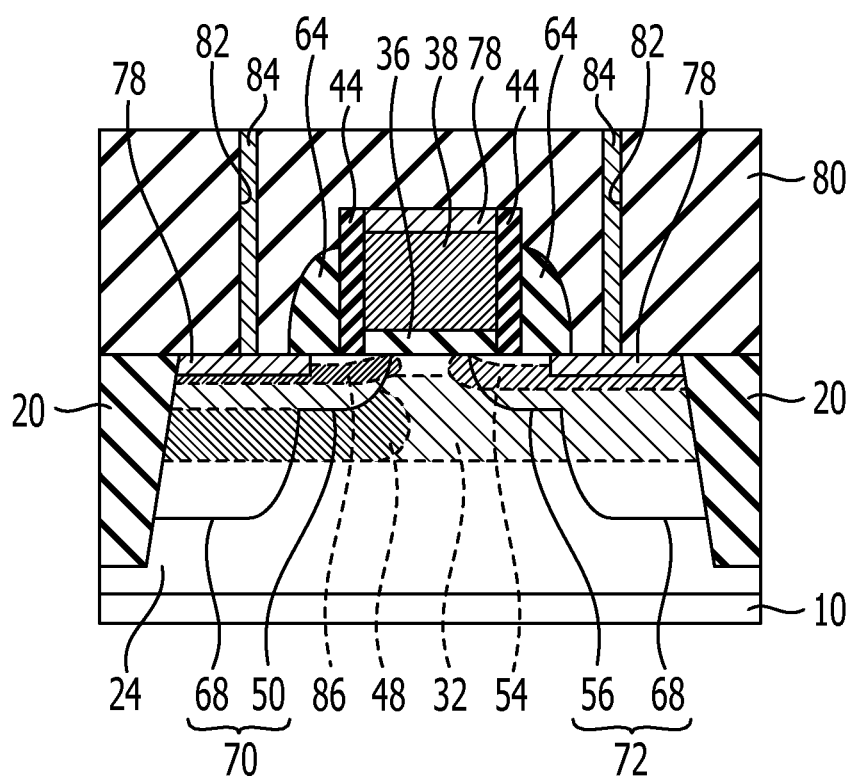
FIG. 19 is a sectional view of a semiconductor device according to a second embodiment of the present invention.
Figure 21:
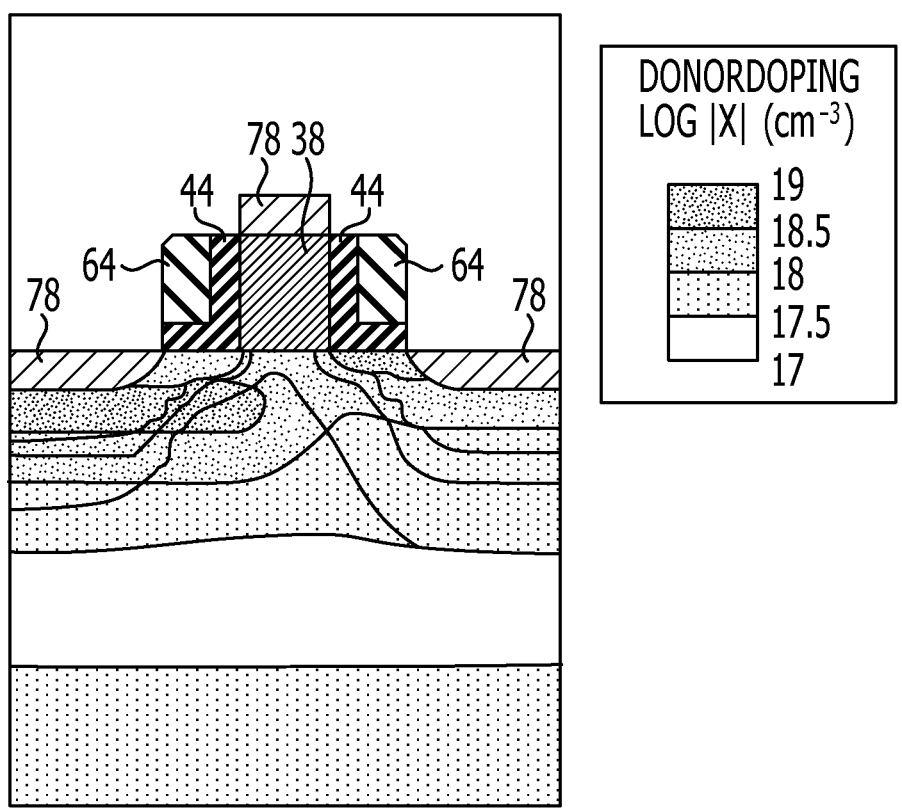
FIG. 21 is a sectional view illustrating a concentration distribution of donor doping in a silicon substrate of a semiconductor device according to the second embodiment.
Figure 22:
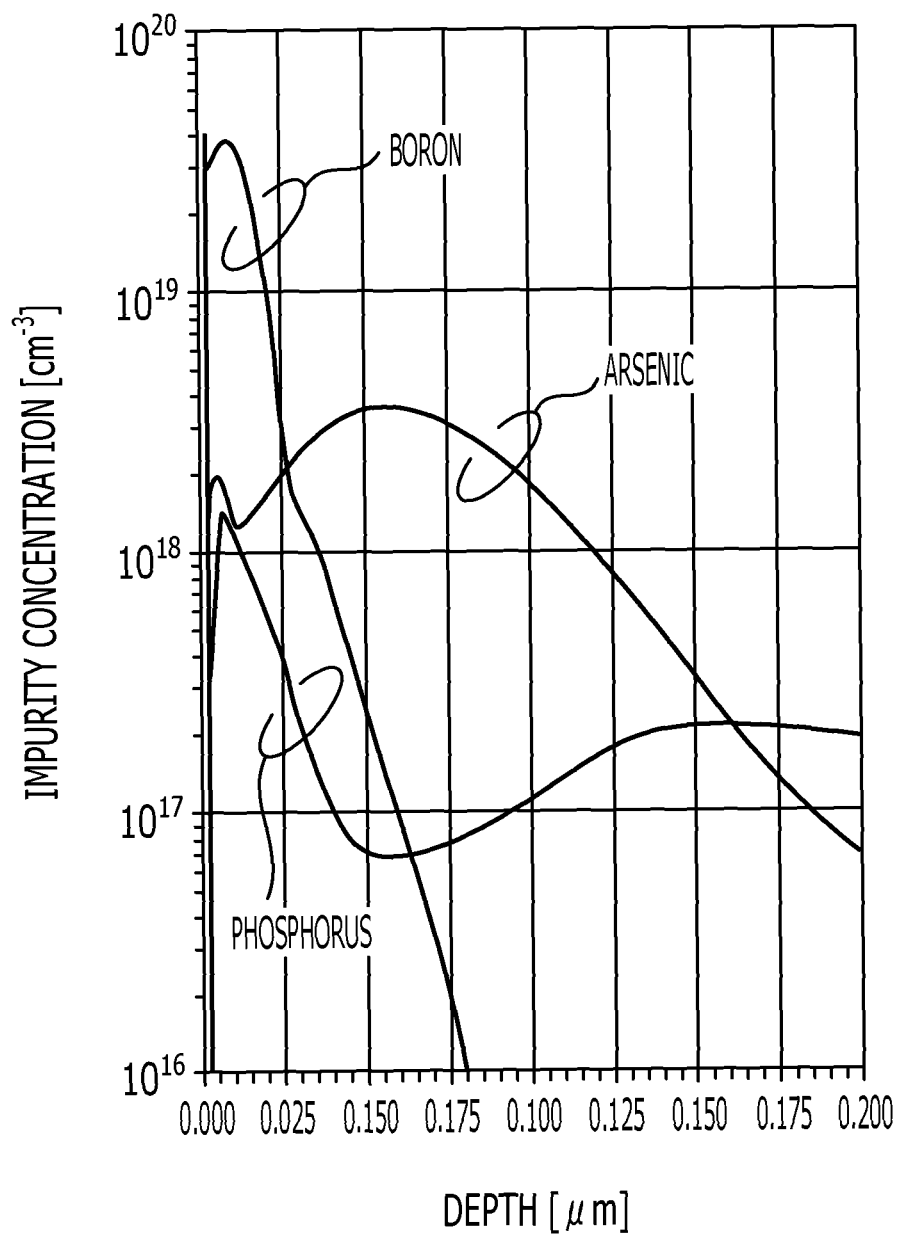
FIG. 22 is a graph illustrating a depth-wise distribution of an impurity concentration in a silicon substrate of a semiconductor device according to the second embodiment.
Figure 23:
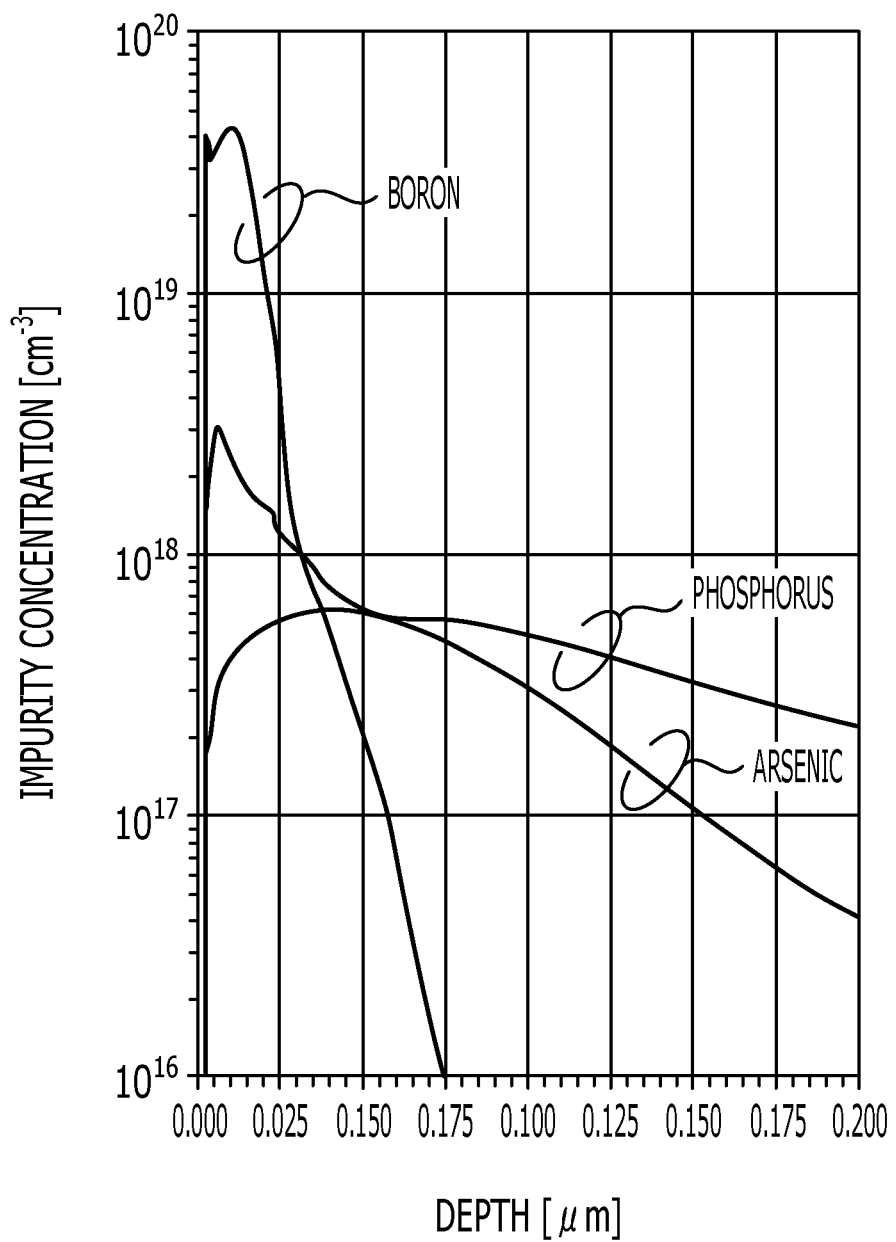
FIG. 23 is a graph illustrating a depth-wise distribution of an impurity concentration in a silicon substrate of a semiconductor device according to the second embodiment.
Figure 24:
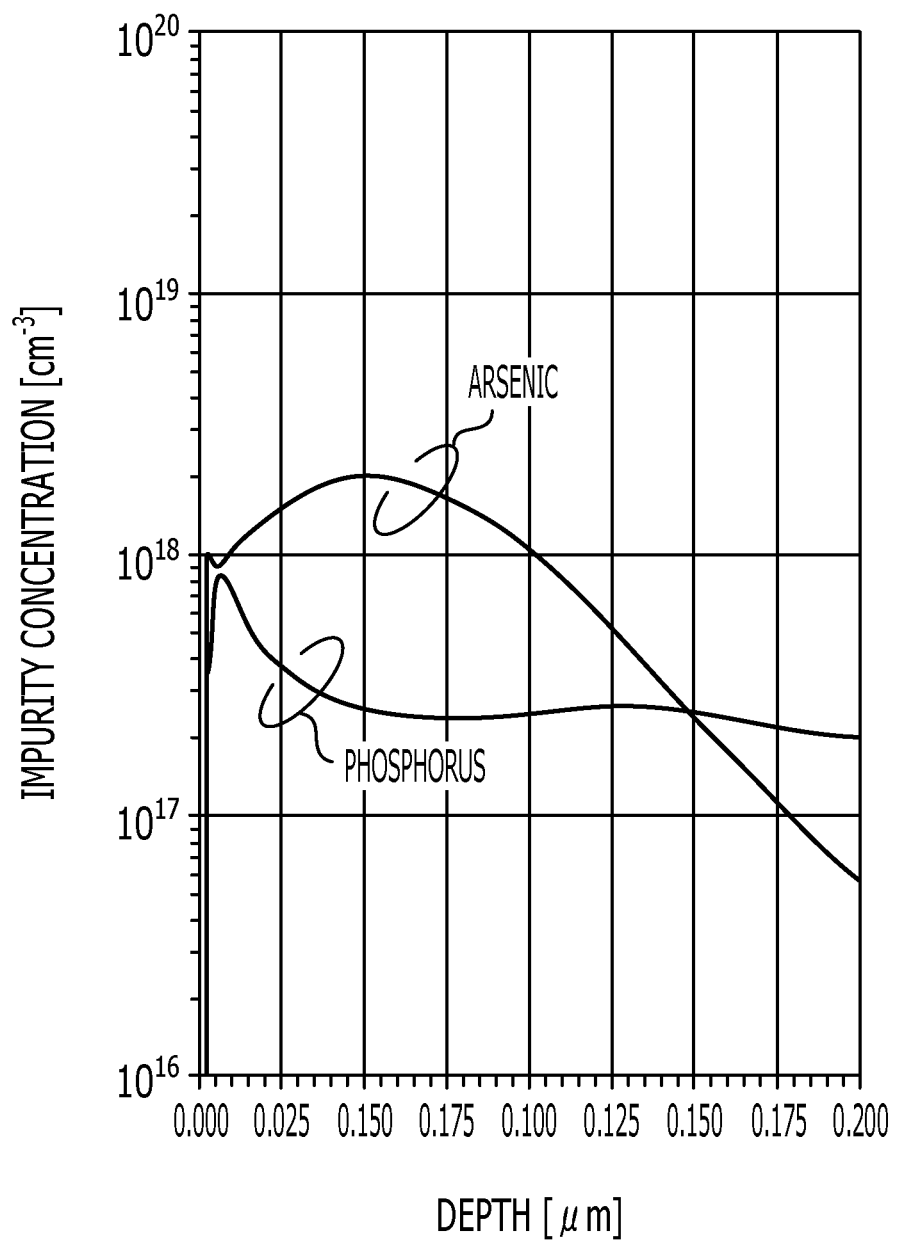
FIG. 24 is a graph illustrating a depth-wise distribution of an impurity concentration in a silicon substrate of a semiconductor device according to the second embodiment.
Figure 25:
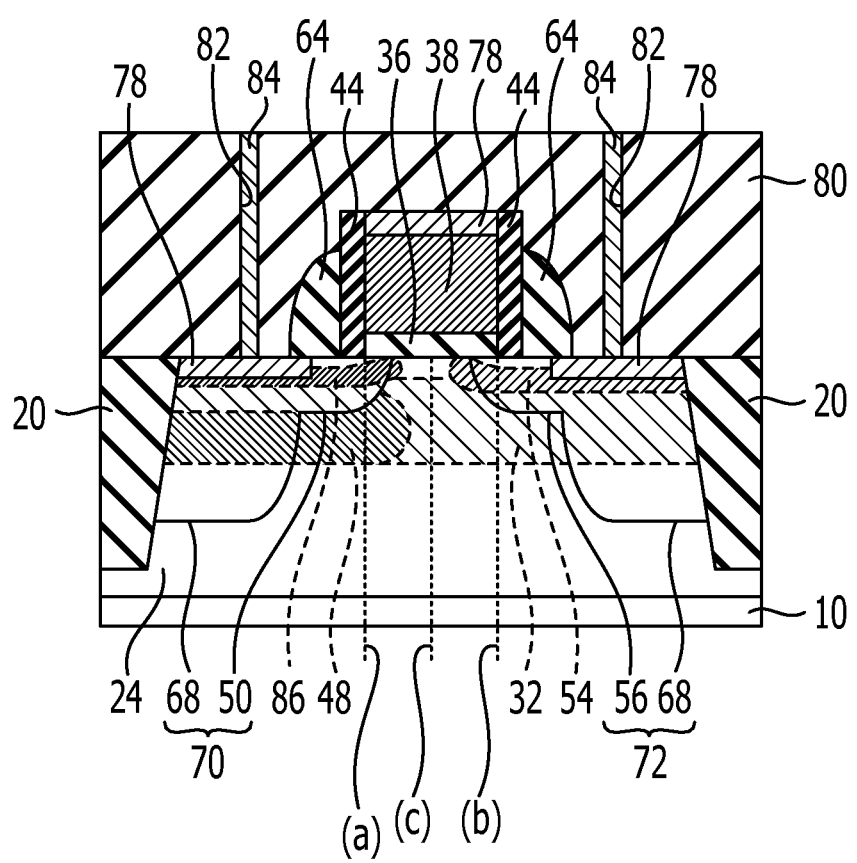
FIG. 25 is a sectional view illustrating the position of the calculated depth-wise distribution of the impurity concentration indicated in each of FIGS. 22 to 24.

FIG. 19 is a schematic sectional view illustrating the structure of a semiconductor device according to the second embodiment. FIG. 20 is a sectional view illustrating a method of manufacturing a semiconductor device according to the second embodiment. FIG. 21 is a sectional view illustrating results obtained by simulating a two-dimensional concentration distribution of donor doping in a silicon substrate of a semiconductor device according to the second embodiment. FIGS. 22 to 24 are graphs illustrating results obtained by simulating a depth-wise distribution of an impurity concentration in a silicon substrate of a semiconductor device according to the second embodiment. FIG. 25 is a sectional view illustrating the position of the calculated depth-wise distribution of the impurity concentration simulated in FIGS. 22 to 24.

As illustrated in FIG. 19, this embodiment of the present invention further includes a pocket impurity-doped layer 86 in the source region side of the silicon substrate 10. Except this constitution, this embodiment is identical to the semiconductor device of the first embodiment as illustrated in FIG. 1. The pocket impurity-doped layer 86 has the concentration peak shallower than that of the extension impurity-doped layer 50.

As described above, when the concentration peak position of the pocket impurity-doped layer 48 at the source region side is positioned deeper than that of the extension impurity-doped layer 50, an increase in the source resistance may be reduced, but the threshold voltage decreases. This decrease in the threshold voltage may be suppressed by making the pocket impurity-doped layer 54 in the drain region side lie shallower and by allowing the impurity concentration to become higher. However, too much higher concentration in the pocket impurity-doped layer 54 causes an increase in the concentration of the pocket region close to the PN-junction underneath the concentration peak position of the extension impurity-doped layer 56. Accordingly, it evokes an increase in the electricity field intensity, thereby increasing a junction leakage current. As a result, there may be provided a case where the suppression of the decrease in the threshold voltage is insufficient only by allowing the concentration of the pocket impurity-doped layer 54 to become higher.

Thus, the semiconductor device of the second embodiment further includes the pocket impurity-doped layer 86 having the concentration peak position located shallower than that of the extension impurity-doped layer 50 in the source region side. The decrease in the threshold voltage may be suppressed by further constructing the pocket impurity-doped layer 86 having the concentration peak position located shallower than that of the extension impurity-doped layer 50 in the source region side. Further constructing the pocket impurity-doped layer 86 in addition to the pocket impurity-doped layer 54 allows a decrease in the threshold voltage to be suppressed without greatly increasing the concentration in the pocket impurity-doped layer 54. In other words, the formation of the pocket impurity-doped layer 86 may yield a similar effect of suppressing the decrease in the threshold voltage by forming the pocket impurity-doped layer 86 even if the concentration of the pocket impurity-doped layer 54 becomes lower than that of the first embodiment. This arrangement allows the intensity of the electrical field located close to the PN-junction underneath the concentration peak position of the extension impurity-doped layer 56 to be reduced, thereby decreasing a junction leakage current.

However, too much higher concentration of the pocket impurity-doped layer 86 causes an increase in the source resistance because the carrier in the extension impurity-doped layer 50 is compensated. So, there is a possibility that the effect obtained by making the pocket impurity-doped layer 48 lie deeper may be lost. In view of the above, the impurity concentration of the pocket impurity-doped layer 86 is desirably set to lower than that of the pocket impurity-doped layer 48.

FIG. 2 is a graph illustrating a relationship between the off-state current ($I_{off}$) of a PMOS transistor having a gate length L of 85 nm and the on-state current ($I_{on}$) of a PMOS transistor having a gate length L of 95 nm. In FIG. 2, the reference symbol "□" denotes characteristics of a semiconductor device according to the second embodiment. The plurality of plotting symbols denote a change in the characteristics caused by changing the dose of the pocket impurity-doped layer 54. The plotting symbol indicated by the reference character "c" denotes characteristics of a semiconductor device manufactured by the method of manufacture described below in accordance with the second embodiment.

As indicated in FIG. 2, for the semiconductor device of the second embodiment, the situation is also similar to that of the semiconductor device of the first embodiment denoted by the reference symbol "Δ". At first, as the dose of the pocket impurity-doped layer 54 increases, the on-state current ($I_{on}$) decreases due to an increase in the threshold voltage, and the off-state current ($I_{off}$) decreases due to a decrease in the sub-threshold leakage current. The semiconductor device of the second embodiment, in particular, is found to have a larger effect of suppressing the subthreshold leakage current than that of the semiconductor device of the first embodiment because the pocket impurity-doped layer 86 is formed in the source region side.

FIG. 3 is a graph illustrating a relationship between the difference between the threshold voltage of a PMOS transistor having a gate length L of 95 nm and that of a PMOS transistor having a gate length L of 85 nm and the off-state current ($I_{off}$) of the PMOS transistor having a gate length L of 85 nm. In FIG. 3, the reference symbol "□" denotes characteristics of a semiconductor device according to the second embodiment. The plurality of plotting symbols denote a change in the characteristics caused by changing the dose of the pocket impurity-doped layer 54. The plotting symbol indicated by the reference character "c" denotes characteristics of a semiconductor device manufactured by the method of manufacture described below in accordance with the second embodiment.

As indicated in FIG. 3, for the semiconductor device of the second embodiment, the situation is also similar to that of the semiconductor device of the first embodiment denoted by the reference symbol "Δ". As the dose of the pocket impurity-doped layer 54 increases, the difference between the threshold voltages becomes smaller, and the short-channel effect may be suppressed.

For example, as illustrated in a manner similar to the method of manufacturing the semiconductor device illustrated in FIGS. 4A to 9A in accordance with the first embodiment, the n-well 24, the channel impurity-doped layers 28 and 32, the gate insulating films 34 and 36, the gate electrode 38, the sidewall spacer 44, and the like are formed.

The source region of the p-type low-leakage transistor is exposed by photolithography to form the photoresist film 46 that covers the rest of the region.

An n-type impurity is ion implanted by using the photoresist film 46, the gate electrode 38, and the sidewall spacer 44 as a mask to form a pocket impurity-doped layer 48 in a deep position in the source region of the p-type low-leakage transistor. For the ion implantation condition, a condition similar to that of the first embodiment may be applied.

A p-type impurity is ion implanted by using the photoresist film 46, the gate electrode 38, and the sidewall spacer 44 as a mask to form an impurity-doped layer 50 that becomes an extension region of the source diffusion layer in the source region of the p-type low-leakage transistor. For the ion implantation condition, a condition similar to that of the first embodiment may be applied.

Figure 20A:
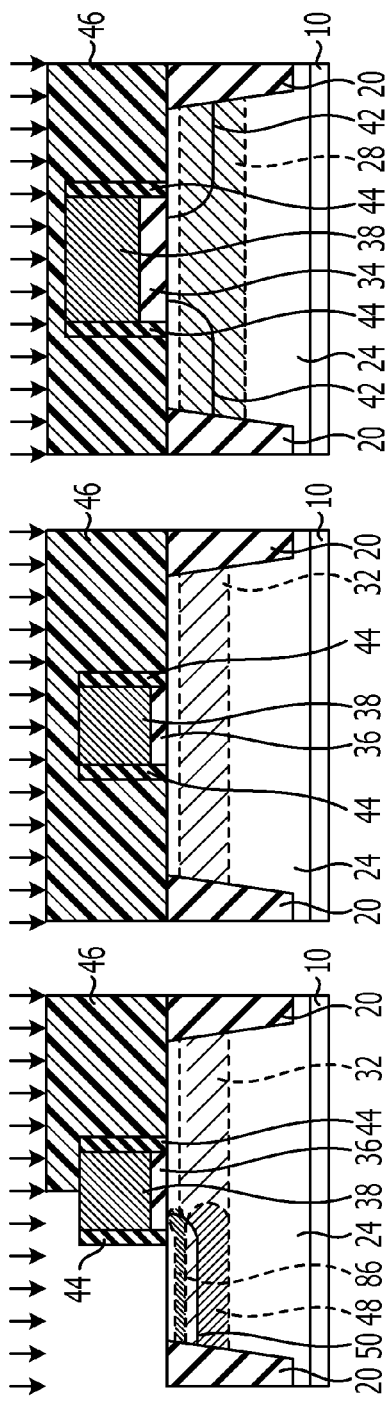
FIGS. 20A and 20B are sectional process views illustrating a method of manufacturing a semiconductor device according to the second embodiment.

In FIG. 20A, an n-type impurity is ion implanted by using the photoresist film 46, the gate electrode 38, and the sidewall spacer 44 as a mask to form a pocket impurity-doped layer 86 in a shallow position in the source region of the p-type low-leakage transistor. The condition of the ion implantation is described as follows: phosphorus ions ($P^+$), for example, are used as the n-type impurity; the acceleration energy is set to, for example, 25±10 keV, or for example, 25 keV; the dose is set to, for example, $8.0 \times 10^{12}$ $cm^{-2}$±10%, or for example, $8.0 \times 10^{12}$ $cm^{-2}$. The tilt angle is, for example, 30±3 degrees, or for example 30 degrees. In this occasion, the fact that there are transistors disposed in different directions is taken into consideration, and the ions with the dose of $2.0 \times 10^{12}$ $cm^{-2}$ are ion implanted in each of four directions tilted toward the ±X axis and the ±Y axis to the substrate normal.

In addition, the pocket impurity-doped layers 48 and 86 and the extension impurity-doped layer 50 may be formed in any orders. In forming of the pocket impurity-doped layers 48 and 86 and the impurity-doped layer 50, the condition of the ion implantation is adjusted appropriately as a concentration peak position of the pocket impurity-doped layer 48 becomes deeper than a concentration peak position of the extension impurity-doped layer 50, and as a concentration peak position of the pocket impurity-doped layer 86 becomes shallower than a concentration peak position of the extension impurity-doped layer 50.

The photoresist film 46 is removed by e.g., ashing. The drain region of the p-type low-leakage transistor is exposed by photolithography from a photoresist film 58 that covers the rest of the region.

An n-type impurity is ion implanted by using the photoresist film 58, the gate electrode 38, and the sidewall spacer 44 as a mask to form a pocket impurity-doped layer 54 in a shallow position of the drain region of the p-type low-leakage transistor. The condition of the ion implantation is described as follows: phosphorus ions ($P^+$), for example, are used as the n-type impurity; the acceleration energy is set to, for example, 25±10 keV, or for example, 25 keV; the dose is set to $3.8 \times 10^{13}$ $cm^{-2}$+10%, or for example, $3.8 \times 10^{13}$ $cm^{-2}$. The tilt angle is, for example, 30±3 degrees, or for example, 30 degrees. In this occasion, the fact that there are transistors disposed in different directions is taken into consideration, and the ions with the dose of $9.6 \times 10^{12}$ $cm^{-2}$ are ion implanted in each of four directions tilted toward the ±X axis and the ±Y axis to the substrate normal. However, this condition of the ion implantation is a condition having a lower concentration than that of the first embodiment.

Figure 20B:
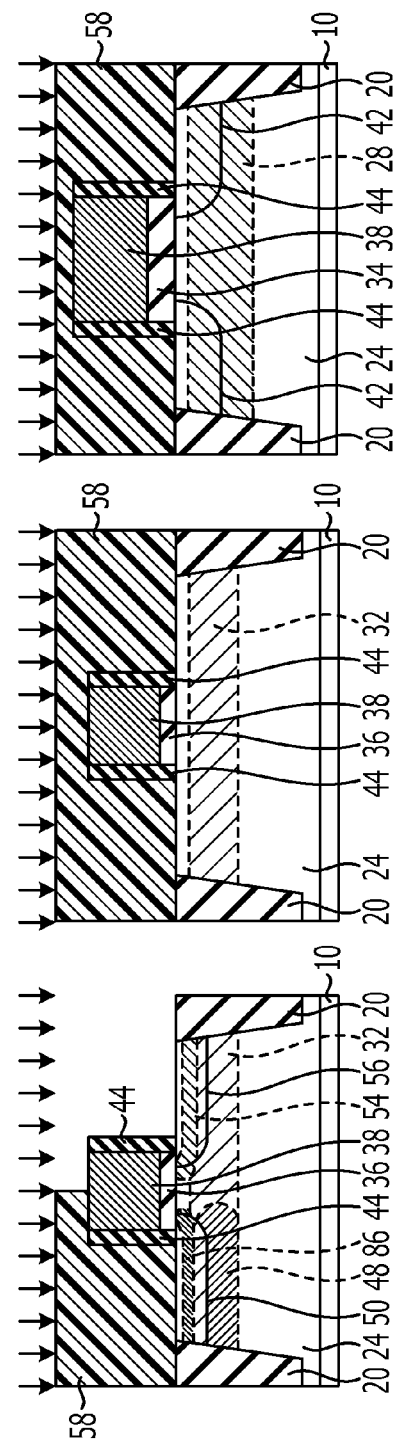

In FIG. 20B, a p-type impurity is ion implanted by using the photoresist film 58, the gate electrode 38, and the sidewall spacer 44 as a mask to form an impurity-doped layer 56 that becomes an extension region of the drain diffusion layer in the drain region of the p-type low-leakage transistor. The condition of the ion implantation may use the same condition as for the extension impurity-doped layer 50 that is formed in the source region side.

In addition, either the pocket impurity-doped layer 54 or the extension impurity-doped layer 56 may be formed first. When the pocket impurity-doped layer 54 and the extension impurity-doped layer 56 are formed, the condition of the ion implantation is adjusted appropriately as the concentration peak position of the pocket impurity-doped layer 54 becomes shallower than that of the extension impurity-doped layer 56.

The photoresist film 58 is removed by e.g., ashing. The semiconductor device of the second embodiment may be completed to be built in a manner similar to the method of manufacturing the semiconductor device as illustrated in, for example, FIGS. 10A to 12B in accordance with the first embodiment.

FIG. 21 is a sectional view illustrating results obtained by simulating a two-dimensional concentration distribution of donor doping in a silicon substrate in respect to the p-type low-leakage transistor manufactured as indicated in the above method in accordance with the second embodiment.

As illustrated in FIG. 21, the p-type low-leakage transistor of the second embodiment has a concentration peak of donor doping in a deep position of the source region side because the pocket impurity-doped layer 48 is formed in a deep position in a manner similar to that of the first embodiment. In addition, the transistor has a concentration peak of donor doping in a shallow position of the drain region side because the pocket impurity-doped layer 54 is formed in a shallow position. These concentration peak positions are located at a deep position for the source region side and located at a shallow position for the drain region side compared to the typical profile of the donor doping of the PMOS transistor illustrated in FIG. 14.

FIGS. 22 to 24 show results obtained by simulating a depth-wise distribution of an impurity concentration in the silicon substrate 10 in respect to the p-type low-leakage transistor manufactured as indicated in the above method in accordance with the second embodiment. FIG. 22 is a graph illustrating results obtained by simulating a depth-wise distribution underneath the source region side of the end of the gate electrode 38. It illustrates an impurity concentration distribution taken along the dotted line (a) of FIG. 25. FIG. 23 is a graph illustrating results obtained by simulating a depth-wise distribution underneath the drain region side of the end of the gate electrode 38. It illustrates an impurity concentration distribution taken along the dotted line (b) of FIG. 25. FIG. 24 is a graph illustrating results obtained by simulating a depth-wise distribution underneath the center point of the gate electrode 38. It illustrates an impurity concentration distribution taken along the dotted line (c) of FIG. 25.

In FIGS. 22 to 24, the line denoted by the reference word "Arsenic" illustrates an impurity concentration distribution of the pocket impurity-doped layer 48, and the line denoted by the reference word "Phosphorus" illustrates an impurity concentration distribution of the pocket impurity-doped layers 54 and 86. In addition, in FIG. 22, the line denoted by the reference word "Boron" illustrates an impurity concentration distribution of the extension impurity-doped layer 50 at the source region side. Besides, in FIG. 23, the line denoted by the reference word "Boron" illustrates an impurity concentration distribution of the extension impurity-doped layer 56 at the drain region side.

As illustrated in FIG. 22, the concentration peak position of the impurity-doped layer 48 lies deeper than that of the extension impurity-doped layer 50 that forms the extension region in the source diffusion layer. In addition, the concentration peak position of the pocket impurity-doped layer 86 is positioned shallower than that of the extension impurity-doped layer 50 in the source diffusion layer. In addition, as illustrated in FIG. 23, the concentration peak position of the impurity-doped layer 54 lies shallower than that of the extension impurity-doped layer 56 that forms the extension region in the drain diffusion layer.

The above results of the simulation verify that the concentration peak position of the pocket impurity-doped layer 48 may be positioned deeper than that of the extension impurity-doped layer 50 in respect to the p-type low-leakage transistor manufactured as indicated in the above method in accordance with the second embodiment. Besides, the results also verify that the concentration peak positions of the pocket impurity-doped layers 54 and 86 may be positioned shallower than that of the extension impurity-doped layer 56. In addition, as illustrated in FIGS. 2 and 3, employing such an impurity profile allows a MIS transistor in which a driving current is large and a leakage current is small to be built.

As described above, according to the second embodiment, the pocket impurities implanted into the extension impurity-doped layer may be reduced by forming the pocket impurity-doped layer, the concentration peak of which is positioned deeper than that of the extension impurity-doped layer at the source region side. This allows an increase in the source resistance to be suppressed, thereby increasing the driving current. In addition, since the impurity concentration of the pocket impurity-doped layer may be increased while suppressing the effect upon the source resistance, a punch-through immunity between the source and the drain regions may be effectively improved.

The pocket impurity-doped layer that has a concentration peak position shallower than that of the extension impurity-doped layer at the drain region side is also formed. Accordingly, the electric field that is generated in the PN-junction located underneath the concentration peak position of the extension impurity-doped layer may be reduced. This allows a junction leakage current between the drain diffusion layer and the substrate to be reduced.

A decrease in the threshold voltage caused by making the concentration peak position of the pocket impurity-doped layer at the source region side lie deeper than that of the extension impurity-doped region may be suppressed by making the pocket impurity-doped layer at the drain region side lie shallower and by allowing the impurity concentration to become higher. These may reduce the subthreshold leakage current and the short-channel effect.

The pocket impurity-doped layer that has a concentration peak position shallower than that of the extension impurity-doped layer at the source region side is also formed. Accordingly, a decrease in the threshold voltage may be suppressed without greatly increasing the impurity concentration of the pocket impurity-doped layer at the drain region side. This allows a junction leakage current between the drain diffusion layer and the substrate to be decreased.

Additionally, such a configuration allows the impurity concentration of the channel impurity-doped layer to be decreased. This may further decrease a junction leakage current between the drain diffusion layer and the substrate.

A semiconductor device and a method of manufacturing the semiconductor device according to a third embodiment of the present invention is illustrated by using FIGS. 26 to 32. The same numbering is used for the constituents identical to those of the semiconductor device and the method of manufacturing the semiconductor device according to the first and the second embodiments illustrated in FIGS. 1 to 25. Accordingly, the explanation is omitted and the numbering makes the explanation simple.

Figure 26:
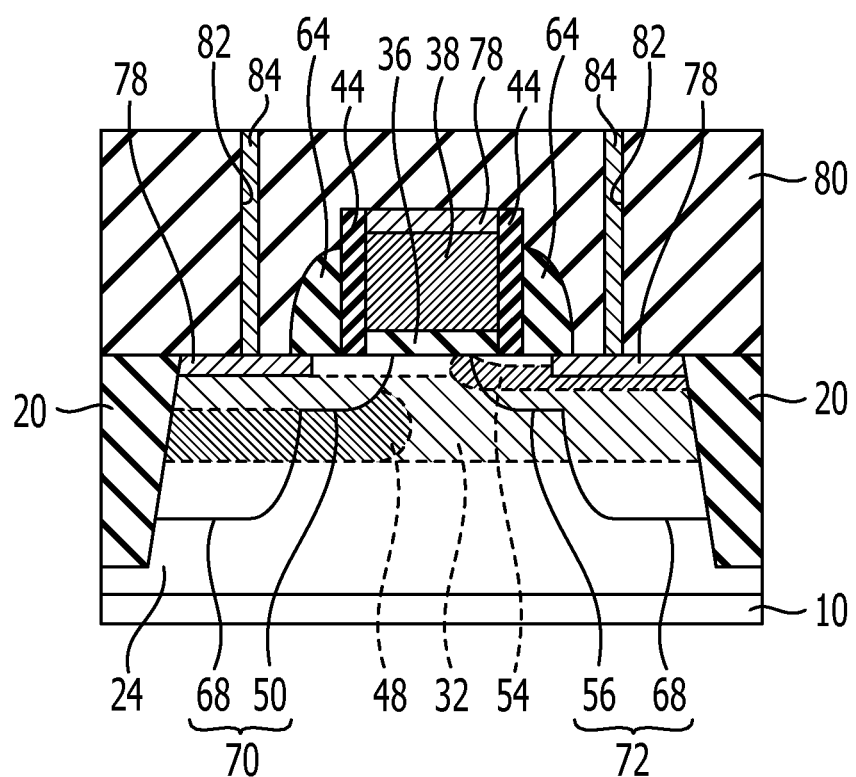
FIG. 26 is a sectional view of a semiconductor device according to a third embodiment of the present invention.
Figure 27:
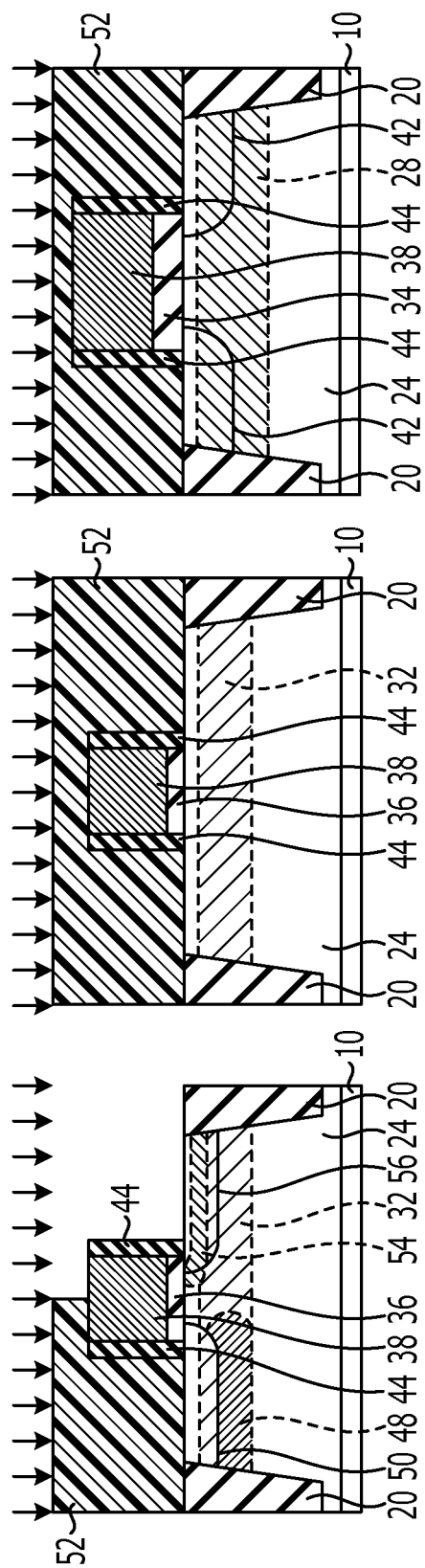
FIG. 27 is a sectional view illustrating a method of manufacturing a semiconductor device according to the third embodiment.
Figure 28:
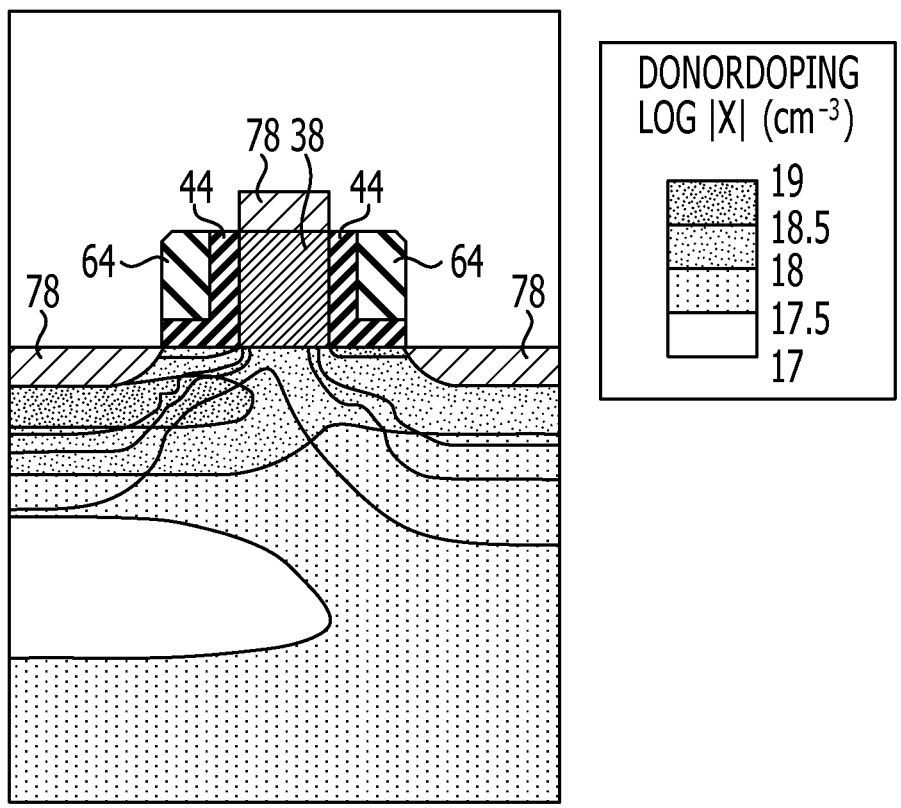
FIG. 28 is a sectional view illustrating a concentration distribution of donor doping in a silicon substrate of a semiconductor device according to the third embodiment.
Figure 29:
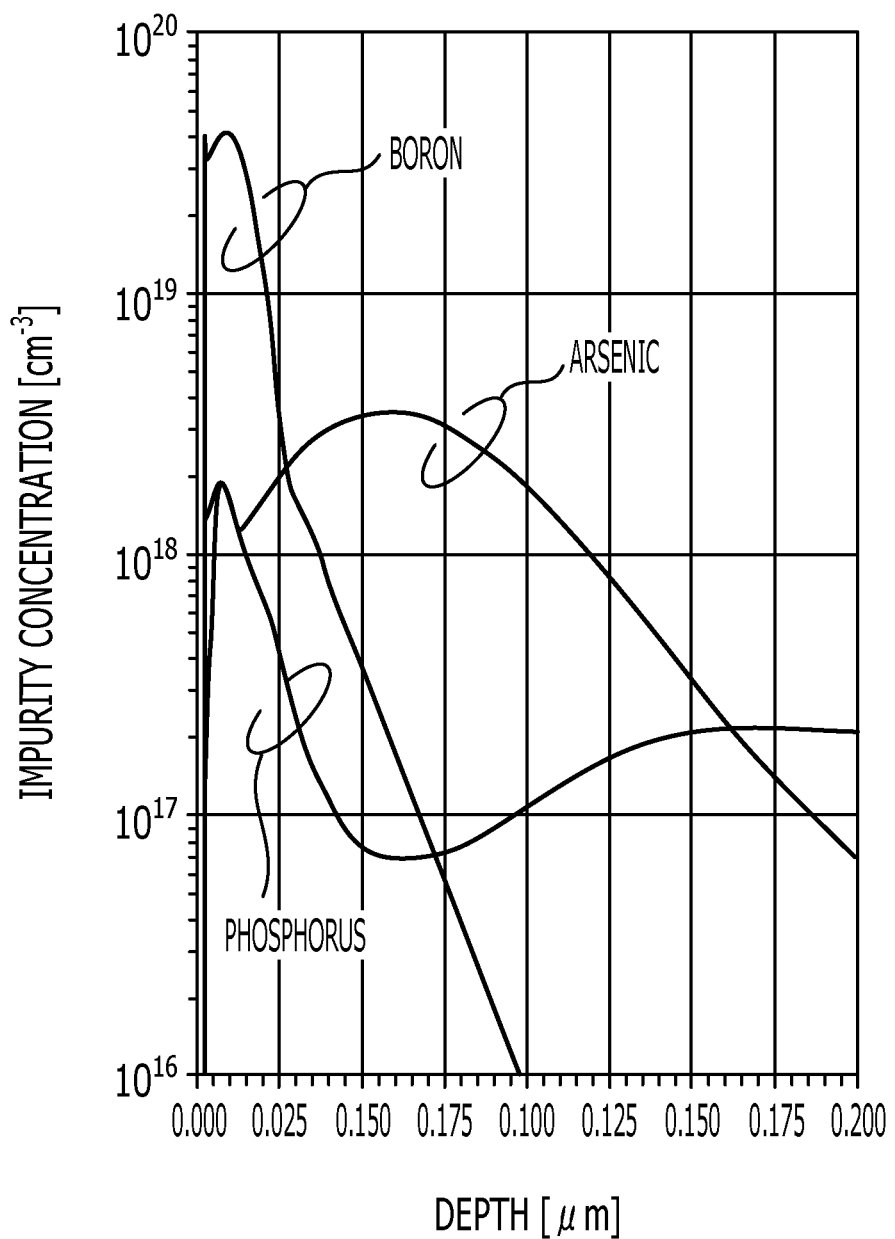
FIG. 29 is a graph illustrating a depth-wise distribution of an impurity concentration in a silicon substrate of a semiconductor device according to the third embodiment.
Figure 30:
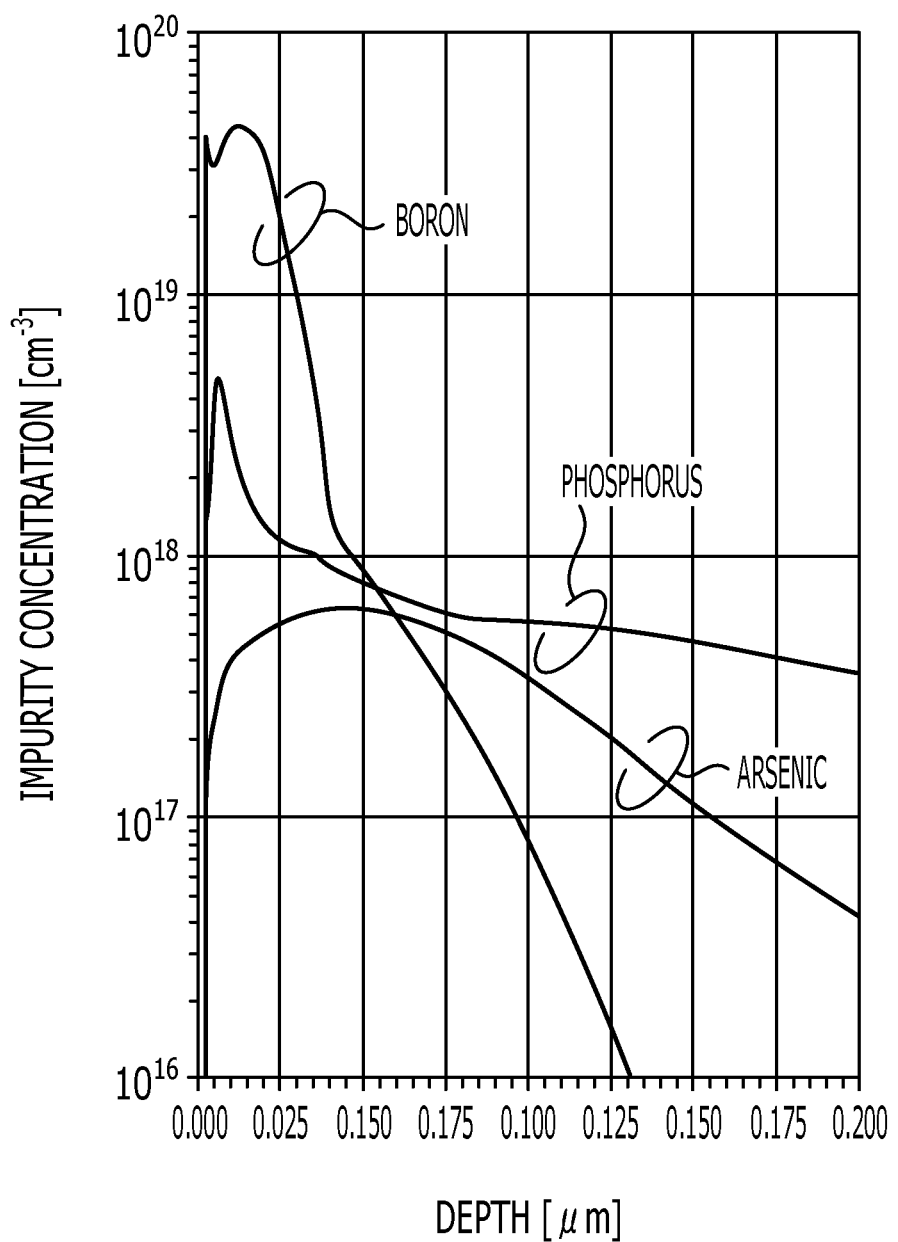
FIG. 30 is a graph illustrating a depth-wise distribution of an impurity concentration in a silicon substrate of a semiconductor device according to the third embodiment.
Figure 31:
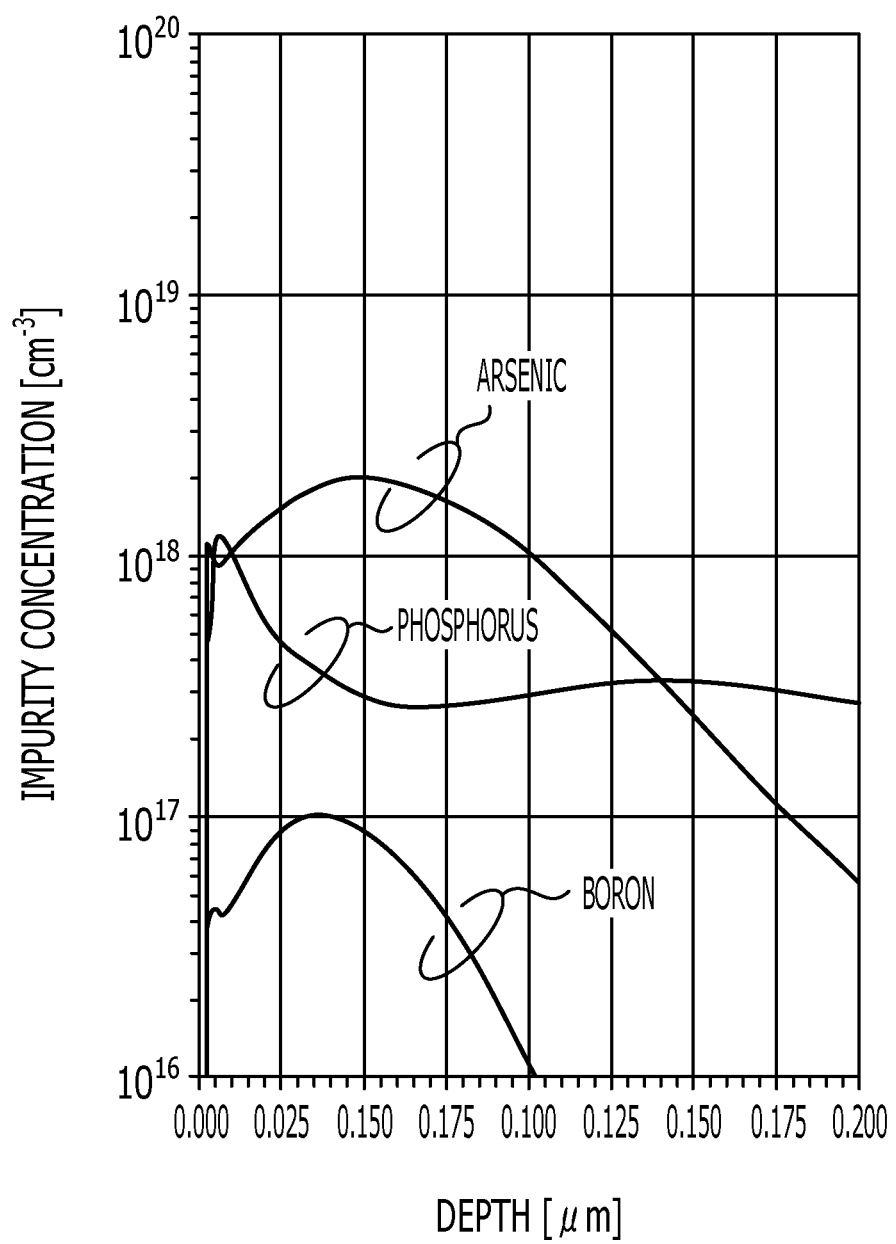
FIG. 31 is a graph illustrating a depth-wise distribution of an impurity concentration in a silicon substrate of a semiconductor device according to the third embodiment.
Figure 32:
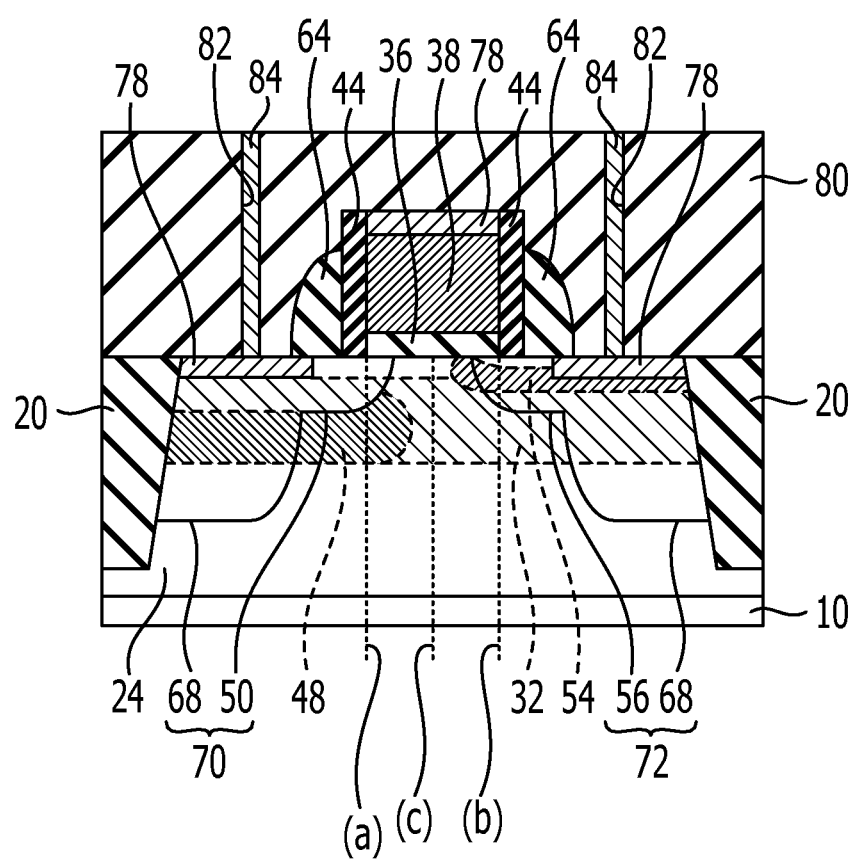
FIG. 32 is a sectional view illustrating the position of the calculated depth-wise distribution of the impurity concentration indicated in each of FIGS. 29 to 31.

FIG. 26 is a schematic sectional view illustrating the structure of a semiconductor device according to the third embodiment. FIG. 27 is a sectional view illustrating a method of manufacturing a semiconductor device according to the third embodiment. FIG. 28 is a sectional view illustrating results obtained by simulating a two-dimensional concentration distribution of donor doping in a silicon substrate of a semiconductor device according to the third embodiment. FIGS. 29 to 31 are graphs illustrating results obtained by simulating a depth-wise distribution of an impurity concentration in a silicon substrate of a semiconductor device according to the third embodiment. FIG. 32 is a sectional view illustrating the position of the calculated depth-wise distribution of the impurity concentration simulated in FIGS. 29 to 31.

As illustrated in FIG. 26, in the semiconductor device of the third embodiment, the extension impurity-doped layer 56 in the drain diffusion layer 72 is positioned deeper and has a lower concentration peak than the extension impurity-doped layer 50 in the source diffusion layer 70. Except these constitutions, this embodiment is identical to the semiconductor device of the first embodiment as illustrated in FIG. 1.

As described above, when the concentration peak position of the pocket impurity-doped layer 48 at the source region side is positioned deeper than that of the extension impurity-doped layer 50 in the source side, an increase in the source resistance may be reduced, but the threshold voltage decreases. This decrease of the threshold voltage may be suppressed by allowing the impurity concentration of the pocket impurity-doped layer 54 at the drain region side to become higher. However, too much higher concentration in the pocket impurity-doped layer 54 causes an increase in the concentration in the pocket region close to the PN-junction underneath the concentration peak position of the extension impurity-doped layer 56 in the drain side. Accordingly, it evokes an increase in the electricity field intensity, thereby increasing a junction leakage current. As a result, there may be provided a case where the suppression of the decrease in the threshold voltage is difficult only by allowing the concentration of the pocket impurity-doped layer 54 to become higher.

Thus, in the semiconductor device of the third embodiment, the intensity of the electric field adjacent to the PN-junction underneath the concentration peak position of the extension impurity-doped layer 56 is reduced by allowing the peak concentration of the extension impurity-doped layer 56 to become lower and by making the concentration peak position lie deeper instead of allowing the impurity concentration of the pocket impurity-doped layer 54 to become higher. This arrangement allows a junction leakage current located at the PN-junction underneath the concentration peak position of the extension impurity-doped layer 56 to be decreased.

Besides, the pocket impurity-doped layer 86 of the semiconductor device of the second embodiment may be further added to the semiconductor device of the third embodiment.

FIG. 2 is a graph illustrating a relationship between the off-state current ($I_{off}$) of a PMOS transistor having a gate length L of 85 nm and the on-state current ($I_{on}$) of a PMOS transistor having a gate length L of 95 nm. In FIG. 2, the reference symbol "◇" denotes characteristics of a semiconductor device according to the third embodiment. The plurality of plotting symbols denote a change in the characteristics caused by changing the dose of the pocket impurity-doped layer 54. The plotting symbol indicated by the reference character "d" denotes characteristics of a semiconductor device manufactured by the method of manufacture described below in accordance with the third embodiment.

As indicated in FIG. 2, for the semiconductor device of the third embodiment, the situation is also similar to that of the semiconductor device of the first embodiment denoted by the reference symbol "Δ". At first, as the dose of the pocket impurity-doped layer 54 increases, the on-state current ($I_{on}$) decreases due to an increase in the threshold voltage, and the off-state current ($I_{off}$) decreases due to a decrease in the subthreshold leakage current. The semiconductor device of the third embodiment, in particular, is found to have a larger effect of suppressing the subthreshold leakage current than that of the semiconductor device of the first embodiment because the impurity concentration of the extension impurity-doped layer 56 at the drain region side becomes low and its position lies deep.

FIG. 3 is a graph illustrating a relationship between the difference between the threshold voltage of a PMOS transistor having a gate length L of 95 nm and that of a PMOS transistor having a gate length L of 85 nm and the off-state current ($I_{off}$) of the PMOS transistor having a gate length L of 85 nm. In FIG. 3, the reference symbol "◇" denotes characteristics of a semiconductor device according to the third embodiment. The plurality of plotting symbols denote a change in the characteristics caused by changing the dose of the pocket impurity-doped layer 54. The plotting symbol indicated by the reference character "d" denotes characteristics of a semiconductor device manufactured by the method of manufacture described below in accordance with the third embodiment.

As indicated in FIG. 3, for the semiconductor device of the third embodiment, the situation is also similar to that of the semiconductor device of the first embodiment denoted by the reference symbol "Δ". As the dose of the pocket impurity-doped layer 54 increases, the difference between the threshold voltages becomes smaller, and the short-channel effect may be reduced. For the semiconductor device of the third embodiment, the immunity for the short-channel effect is low compared to the semiconductor devices of the first and the second embodiments because the extension impurity-doped layer 56 is positioned deep. However, when compared with the semiconductor devices of Comparative Examples 1 and 2, the semiconductor of the third embodiment has a low subthreshold leakage current and has a high immunity for the short-channel effect.

A method of manufacturing a semiconductor device according to the third embodiment is illustrated by using FIG. 27.

For example, as illustrated in a manner similar to the method of manufacturing the semiconductor device illustrated in FIGS. 4A to 9B in accordance with the first embodiment, the n-well 24, the channel impurity-doped layers 28 and 32, the gate insulating films 34 and 36, the gate electrode 38, the sidewall spacer 44, the pocket impurity-doped layer 48, the extension impurity-doped layer 50, and the like are formed.

The drain region of the p-type low-leakage transistor is exposed by photolithography to form a photoresist film 52 that covers the rest of the region.

An n-type impurity is ion implanted by using the photoresist film 52, the gate electrode 38, and the sidewall spacer 44 as a mask to form a pocket impurity-doped layer 54 located at a shallow position in the drain region of the p-type low-leakage transistor. The condition of the ion implantation is described as follows: phosphorus ions (P$^+$), for example, are used as the n-type impurity; the acceleration energy is set to, for example, 25±10 keV, or for example, 25 keV; the dose is set to 5.2×10$^{13}$ cm$^{-2}$+10%, or for example, 5.2×10$^{13}$ cm$^{-2}$. The tilt angle is, for example, 30±3 degrees, or for example, 30 degrees. In this occasion, the fact that there are transistors disposed in different directions is taken into consideration, and the ions with the dose of 1.3×10$^{13}$ cm$^{-2}$ are ion implanted in each of four directions tilted toward the ±X axis and the ±Y axis to the substrate normal.

A p-type impurity is ion implanted by using the photoresist film 52, the gate electrode 38, and the sidewall spacer 44 as a mask to form an extension impurity-doped layer 56 that becomes an extension region of the drain diffusion layer in the drain region of the p-type low-leakage transistor (FIG. 27). The condition of the ion implantation is described as follows: boron ions (B$^+$), for example, are used as the p-type impurity; the acceleration energy is set to, for example, 1.5±0.3 keV, or for example, 1.5 keV; the dose is set to, for example, 1.0×10$^{15}$ cm$^{-2}$±10%, or for example, 1.0×10$^{15}$ cm$^{-2}$. The tilt angle is, for example, 0 degrees. In addition, this ion implantation condition has the same dose as that of the first embodiment, but the acceleration voltage is higher. So, the extension impurity-doped layer 56 formed lies more widely and deeper than that of the first embodiment, and the impurity concentration also becomes lower.

Besides, either the pocket impurity-doped layer 54 or the extension impurity-doped layer 56 may be formed first. When the pocket impurity-doped layer 54 and the extension impurity-doped layer 56 are formed, the condition of the ion implantation is adjusted appropriately as the concentration peak position of the pocket impurity-doped layer 54 becomes shallower than that of the extension impurity-doped layer 56 (extension impurity-doped layer 50).

Next, the photoresist film 52 is removed by e.g., ashing. After that, the semiconductor device of the third embodiment may be completed to be built in a manner similar to the method of manufacturing the semiconductor device as illustrated in, for example, FIGS. 10A to 12B in accordance with the first embodiment.

FIG. 28 is a sectional view illustrating results obtained by simulating a two-dimensional concentration distribution of donor doping in a silicon substrate in respect to the p-type low-leakage transistor manufactured as indicated in the above method in accordance with the third embodiment.

As illustrated in FIG. 28, the p-type low-leakage transistor of the third embodiment has a concentration peak of donor doping in a deep position of the source region side because the pocket impurity-doped layer 48 is formed in a deep position in a manner similar to that of the first embodiment. In addition, the transistor has a concentration peak of donor doping in a shallow position of the drain region side because the pocket impurity-doped layer 54 is formed in a shallow position. These concentration peak positions are located at a deep position for the source region side and located at a shallow position for the drain region side compared to the typical profile of the impurity concentration of the PMOS transistor illustrated in FIG. 14.

FIGS. 29 to 31 show results obtained by simulating a depth-wise distribution of an impurity concentration in the silicon substrate 10 in respect to the p-type low-leakage transistor manufactured as indicated in the above method in accordance with the third embodiment. FIG. 29 is a graph illustrating results obtained by simulating a depth-wise distribution underneath the source region side of the end of the gate electrode 38. It illustrates an impurity concentration distribution taken along the dotted line (a) of FIG. 32. FIG. 30 is a graph illustrating results obtained by simulating a depth-wise distribution underneath the drain region side of the end of the gate electrode 38. It illustrates an impurity concentration distribution taken along the dotted line (b) of FIG. 32. FIG. 31 is a graph illustrating results obtained by simulating a depth-wise distribution underneath the center point of the gate electrode 38. It illustrates an impurity concentration distribution taken along the dotted line (c) of FIG. 32.

In FIGS. 29 to 31, the line denoted by the reference word "Arsenic" illustrates an impurity concentration distribution of the pocket impurity-doped layer 48, and the line denoted by the reference word "Phosphorus" illustrates an impurity concentration distribution of the pocket impurity-doped layer 54. In addition, in FIG. 29, the line denoted by the reference word "Boron" illustrates an impurity concentration distribution of the extension impurity-doped layer 50 at the source region side. Besides, in FIG. 30, the line denoted by the reference word "Boron" illustrates an impurity concentration distribution of the extension impurity-doped layer 56 at the drain region side.

As illustrated in FIG. 29, the concentration peak position of the impurity-doped layer 48 lies deeper than that of the extension impurity-doped layer 50 in the source diffusion layer. In addition, as illustrated in FIG. 30, the concentration peak position of the impurity-doped layer 54 lies shallower than that of the extension impurity-doped layer 56 that forms the extension region in the drain diffusion layer. Additionally, the extension impurity-doped layer 56 in the drain diffusion layer has a lower impurity concentration and is formed in a deeper position than the extension impurity-doped layer 50 in the source diffusion layer.

The above results of the simulation verify that the concentration peak position of the pocket impurity-doped layer 48 may be positioned deeper than that of the extension impurity-doped layer 50 in respect to the p-type low-leakage transistor manufactured as indicated in the above method in accordance with the third embodiment. Besides, the results also verify that the concentration peak position of the pocket impurity-doped layer 54 may be positioned shallower than that of the extension impurity-doped layer 56. In addition, the extension impurity-doped layer 56 in the drain diffusion layer has a lower impurity concentration and lies deeper than the extension impurity-doped layer 50 in the source diffusion layer. In addition, as illustrated in FIGS. 2 and 3, employing such an impurity profile allows a MIS transistor in which a driving current is large and a leakage current is small to be built.

As described above, in accordance with the third embodiment, the pocket impurities implanted into the extension impurity-doped layer may be reduced by forming the pocket impurity-doped layer, the concentration peak of which is positioned deeper than that of the extension impurity-doped layer at the source region side. This arrangement allows an increase in the source resistance to be suppressed, thereby increasing the driving current. In addition, since the impurity concentration of the pocket impurity-doped layer may be increased while suppressing the effect upon the source resistance, a punch-through immunity between the source and the drain regions may be effectively improved.

The pocket impurity-doped layer that has a concentration peak position shallower than that of the extension impurity-doped layer at the drain region side is also formed. Accordingly, the electric field that is generated in the PN-junction located underneath the concentration peak position of the extension impurity-doped layer may be reduced. This allows a junction leakage current between the drain diffusion layer and the substrate to be decreased.

A decrease in the threshold voltage caused by making the concentration peak position of the pocket impurity-doped layer at the source region side lie deeper than that of the extension impurity-doped layer may be suppressed by making the pocket impurity-doped layer at the drain region side lie shallower and by allowing the impurity concentration to become higher. These may reduce the subthreshold leakage current and the short-channel effect.

In addition, the intensity of an electric field adjacent to the PN-junction located underneath the concentration peak position of the extension impurity-doped layer at the drain region side is reduced by making the extension impurity-doped layer at the drain region side have a lower peak concentration and lie deeper than the extension impurity-doped layer at the source region side. This arrangement allows a junction leakage current located at the PN-junction underneath the concentration peak position of the extension impurity-doped layer at the drain region side to be decreased.

Additionally, such a configuration allows the impurity concentration of the channel impurity-doped layer to be decreased. This may further decrease a junction leakage current between the drain diffusion layer and the substrate.

An embodiment is not limited to the above embodiments, and various modifications are possible.

For example, although a semiconductor device including the low-leakage, high-speed, and high-voltage transistors is taken as an example to explain the above embodiments, an aspect of the present invention may be applied to a wide range of semiconductor devices including a MIS transistor in which a driving current is large and a leakage current is small.

In addition, while the PMOS transistor is taken as an example to explain the above embodiments, an aspect of the present invention may be applied to an NMOS transistor in a similar manner.

Additionally, the structure, the constituent material, the manufacturing condition, and the like of the semiconductor device described in the above embodiments are one of examples described, and may be modified appropriately, if desired.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

What is claimed is:

1. A method of manufacturing a semiconductor device, comprising:

forming a gate insulating film on a semiconductor substrate of a first conductivity type;

forming a gate electrode on the gate insulating film;

forming a first resist film covering the semiconductor substrate position at a first side of the gate electrode and exposing the semiconductor substrate position at a second side of the gate electrode;

forming a first pocket region layer by implanting an impurity of the first conductivity type into the semiconductor substrate by using the first resist film and the gate electrode as a mask;

forming a first extension region by implanting an impurity of a second conductivity type into the semiconductor substrate using the first resist film and the gate electrode as masks;

forming a second resist film covering the semiconductor substrate position at the second side of the gate electrode and exposing the semiconductor substrate position at the first side of the gate electrode;

forming a second pocket region by implanting an impurity of the first conductivity type into the semiconductor substrate using the second resist film and the gate electrode as masks; and forming a second extension region by implanting an impurity of the second conductivity type into the semiconductor substrate using the second resist film and the gate electrode as masks, wherein a concentration peak position of the first pocket region is located deeper than a concentration peak position of the first extension region; and a concentration peak position of the second pocket region is located shallower than a concentration peak position of the second extension region.

2. The method according to claim 1, further comprising:

forming a third pocket region by implanting an impurity of the first conductivity type into the semiconductor substrate using the first resist film and the gate electrode as masks, wherein a concentration peak position of the third pocket region is located shallower than the concentration peak position of the first extension region.

3. The method according to claim 2, wherein an impurity concentration of the third pocket region is less than an impurity concentration of the second pocket region.

4. The method according to claim 2, wherein an impurity concentration of the third pocket region is less than an impurity concentration of the first pocket region.

5. The method according to claim 1, further comprising forming a channel region in the semiconductor substrate before forming the gate electrode, wherein a concentration peak position of the channel region is lower than the concentration peak position of the first pocket region and the concentration peak position of the second pocket region.

6. The method according to claim 1, wherein the concentration peak position of the second extension region is located deeper than the concentration peak position of the first extension region.

* * * * *